(12) United States Patent
Kamiguchi et al.

(10) Patent No.: US 9,117,465 B2
(45) Date of Patent: Aug. 25, 2015

(54) NON-LOCAL SPIN VALVE ELEMENT WITH THREE TERMINALS, HARD DISK HEAD, AND MAGNETIC RECORDING AND REPRODUCING APPARATUS

(71) Applicant: KABUSHIKI KAISHA TOSHIBA, Tokyo (JP)

(72) Inventors: Yuuzo Kamiguchi, Yokohama (JP); Satoshi Shirotori, Yokohama (JP); Shinobu Sugimura, Yokohama (JP); Masayuki Takagishi, Kunitachi (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/338,481

(22) Filed: Jul. 23, 2014

(65) Prior Publication Data
US 2015/0029609 A1  Jan. 29, 2015

(30) Foreign Application Priority Data
Jul. 26, 2013 (JP) ................................. 2013-156017

(51) Int. Cl.
| | | |
|---|---|---|
| *G11B 5/39* | (2006.01) | |
| *G11B 5/35* | (2006.01) | |
| *H01F 10/08* | (2006.01) | |
| *G01R 33/09* | (2006.01) | |
| *G01R 33/12* | (2006.01) | |

(52) U.S. Cl.
CPC ................ *G11B 5/35* (2013.01); *G11B 5/3909* (2013.01); *H01F 10/08* (2013.01); *G01R 33/093* (2013.01); *G01R 33/098* (2013.01); *G01R 33/1284* (2013.01); *G11B 2005/3996* (2013.01)

(58) Field of Classification Search
CPC ...... G11B 5/332; G11B 5/3909; G11B 5/399; G01R 33/093; G01R 33/098; G01R 33/1284
USPC .................................................. 360/313–328
See application file for complete search history.

(56) References Cited

U.S. PATENT DOCUMENTS 8,238,064 B2    8/2012  Yamada et al.
2010/0296202 A1 * 11/2010 Boone et al. ................... 360/313

FOREIGN PATENT DOCUMENTS

| JP | 2009-146512 | 7/2009 |
| JP | 2012-234602 | 11/2012 |

OTHER PUBLICATIONS

Jeon, Kun-Rok, et al., "Electrical spin injection and accumulation in CoFe/MgO/Ge contacts at room temperature," Physical Review B 84, American Physical Society, 2011, pp. 165315-1-165315-10.

* cited by examiner

*Primary Examiner* — Craig A. Renner
(74) *Attorney, Agent, or Firm* — Nixon & Vanderhye, P.C.

(57) ABSTRACT

A spin valve element according to an embodiment includes: a nonmagnetic base layer; a first terminal including a first magnetic layer connecting to a portion near one of opposing end faces of the nonmagnetic base layer; a second terminal including a second magnetic layer disposed and connecting to the nonmagnetic base layer so as to be at a distance from the first terminal; a third terminal including a third magnetic layer disposed and connecting to the nonmagnetic base layer so as to be at distances from the first and second terminals, the second terminal and the third terminal connecting to a current source that passes a sense current, and the first terminal and one of the second terminal and the third terminal connecting to a voltage detection unit that detects a voltage.

15 Claims, 25 Drawing Sheets

NON-LOCAL SPIN VALVE ELEMENT WITH THREE TERMINALS, HARD DISK HEAD, AND MAGNETIC RECORDING AND REPRODUCING APPARATUS

CROSS REFERENCE TO RELATED APPLICATIONS

This application is based upon and claims the benefit of priority from the prior Japanese Patent Application No. 2013-156017, filed on Jul. 26, 2013, the entire contents of which are incorporated herein by reference.

FIELD

Embodiments described herein relate generally to spin valve elements, hard disk heads, and magnetic recording and reproducing apparatuses.

BACKGROUND

At present, signals recorded in a hard disk drive is read by detecting, by a magnetic sensor, a leakage magnetic field from recording bits written in a magnetic disk.

However, as the recording density is improved, the size of a recording bit has become very small, on the order of about 10 nm. For this reason, compatibility between the downsizing of magnetic sensors and the improvement in sensitivity thereof has become indispensable. In particular, as the gap length between magnetic shields in a reader has become very narrow, the thickness of magnetic sensor is desired to be 10 nm or less.

However, spin valve elements commonly used at present have a four-layer structure including a magnetization free layer, a nonmagnetic intermediate layer, a synthetic, magnetization pinned layer, and an antiferromagnetic layer. Since the antiferromagnetic layer for pinning the magnetization of the magnetization pinned layer requires a thickness of about 10 nm to have satisfactory magnetization-pinning characteristics in the magnetization pinned layer, it is not easy to reduce the entire thickness of the four-layer structure to 20 nm or less.

DETAILED DESCRIPTION

A spin valve element according to an embodiment includes: a nonmagnetic base layer; a first terminal including a first magnetic layer, in which a direction of magnetization is switchable, the first terminal connecting to a portion near one of opposing end faces of the nonmagnetic base layer in a direction along which the nonmagnetic base layer extends; a second terminal including a second magnetic layer, in which a direction of magnetization is pinned, the second terminal being disposed and connecting to the nonmagnetic base layer so as to be at a distance from the first terminal along the direction in which the nonmagnetic base layer extends; a third terminal including a third magnetic layer, in which a direction of magnetization is pinned to be antiparallel to the direction of magnetization of the second magnetic layer, the third terminal being disposed and connecting to the nonmagnetic base layer so as to be at distances from the first terminal and the second terminal along the direction in which the nonmagnetic base layer extends, the second terminal and the third terminal connecting to a current source that passes a sense current, and the first terminal and one of the second terminal and the third terminal connecting to a voltage detection unit that detects a voltage.

Before embodiments are described, how the embodiments are reached will be described.

Figure 1:
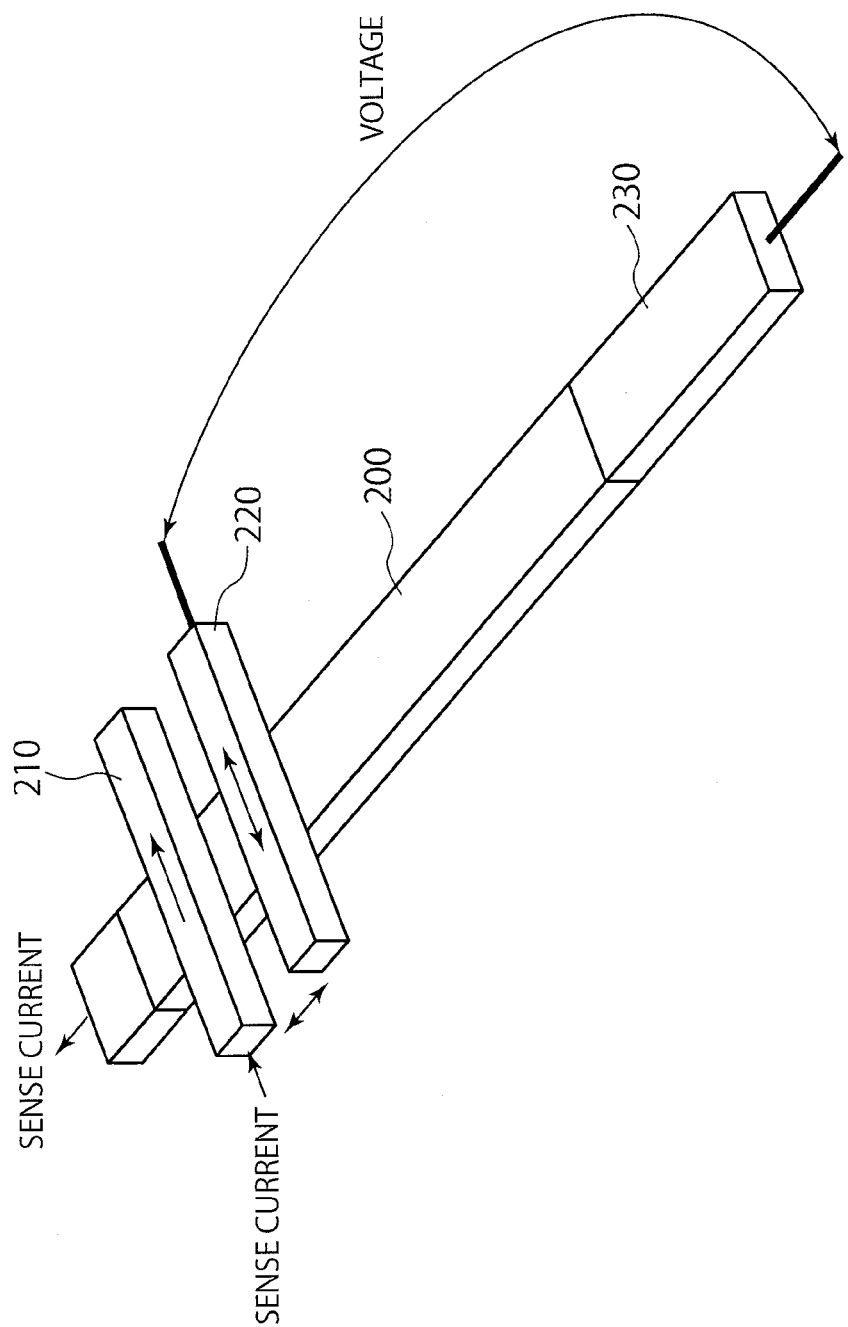
FIG. 1 is a schematic diagram showing a common non-local spin valve element.

FIG. 1 is a schematic diagram of a common non-local spin valve element. This non-local spin valve element has a structure in which a spin injection magnetic member 210 and a spin detection magnetic member 220 are electrically connected to a nonmagnetic base electrode 200. A current source is connected between the spin injection magnetic member 210 and a terminal of the nonmagnetic base electrode 200, and a sense current flows therethrough. A voltmeter is connected between the spin detection magnetic member 220 and the other terminal of the nonmagnetic base electrode 200 to measure a voltage therebetween. In such a common non-local spin valve element, a lead 230 is connected to the other terminal of the nonmagnetic base electrode 200, and the other terminal of the nonmagnetic base electrode 200 is connected to the voltmeter via the lead 230.

A sense current is caused to flow between the nonmagnetic base electrode 200 and the spin injection magnetic member 210. Since the electric resistance in a magnetic material differs between majority spin electrons and minority spin electrons, a spin-polarized current flows through the nonmagnetic base electrode 200, and the electrochemical potential of conduction electrons in the nonmagnetic base electrode 200 differs between up-spin electrons and down-spin electrons.

Figure 2:
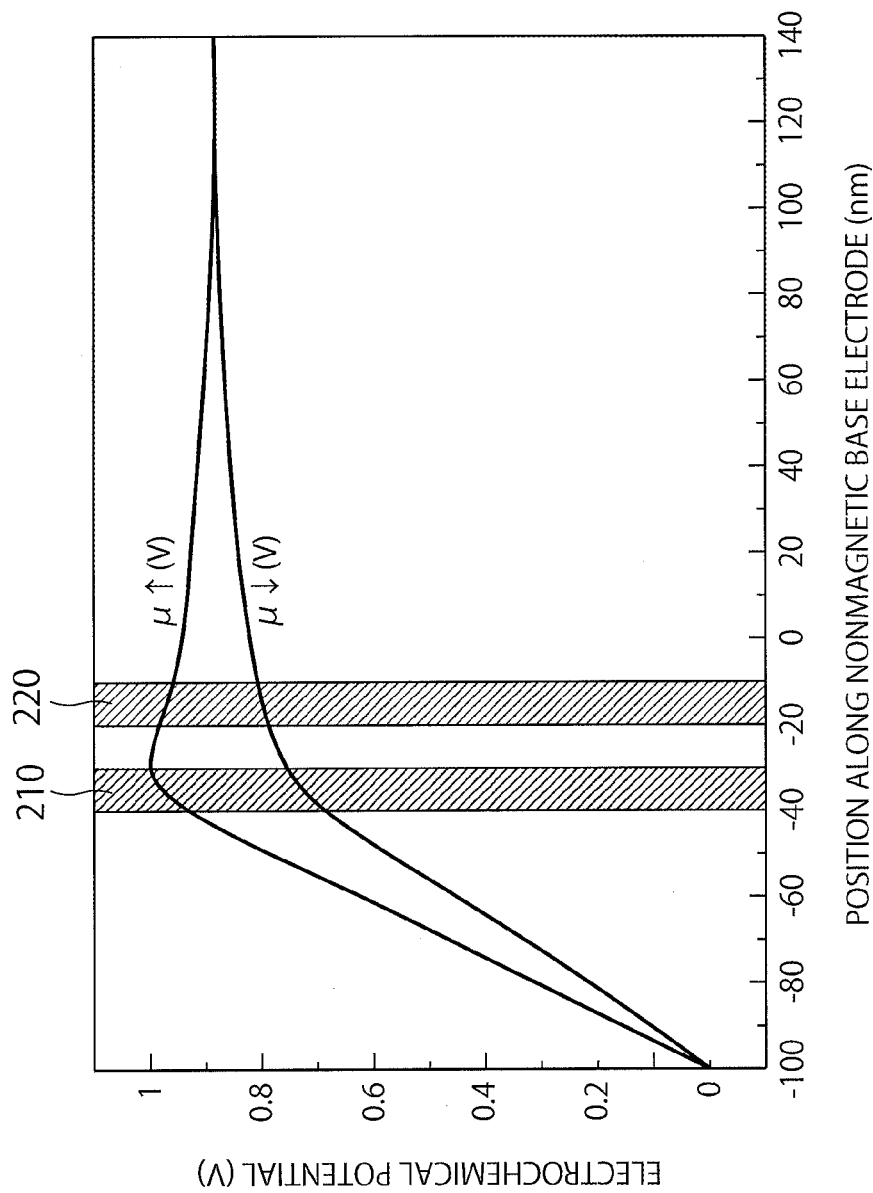
FIG. 2 is a diagram showing an example of electrochemical potential distributions of up-spin electrons and down-spin electrons in a common non-local spin valve element.

FIG. 2 shows an example of up-spin electron electrochemical potential $\mu\uparrow$ and down-spin electron electrochemical potential $\mu\downarrow$ plotted along the center line of the nonmagnetic base electrode 200. The lateral axis in FIG. 2 indicates distance along the nonmagnetic base electrode 200 from a point of origin on the nonmagnetic base electrode 200, and the longitudinal axis indicates electrochemical potential.

In this example, 0V is applied to the nonmagnetic base electrode 200, and a positive voltage is applied to the spin transfer electrode 210. Accordingly, both an up-spin current $I\uparrow$ and a down-spin current $I\downarrow$ flow from the spin transfer electrode 210 to the nonmagnetic base electrode 200. The difference in electrochemical potential ($\mu\uparrow-\mu\downarrow$) caused thereby has a maximum value at an interface with the spin transfer electrode, and relaxed toward zero as the distance therefrom increases. Hereinafter, the difference in electrochemical potential ($\mu\uparrow-\mu\downarrow$) is also referred to as spin accumulation. The spin accumulation is exponentially relaxed with respect to the distance so that the electrochemical potential $\mu\uparrow$ of the up-spin electrons and the electrochemical potential $\mu\downarrow$ of the down-spin electrons have the same value. The distance at which the spin accumulation is relaxed to 1/e (where e is the base of the natural logarithm) is called spin relaxation length $\lambda n$. This value is a material property value, and varies depending on the material for forming the nonmagnetic base electrode 200.

Differential values of electrochemical potential are proportional to the current of spun electrons in respective directions. From FIG. 2, it can be understood that the gradient of $\mu\uparrow$ and the gradient of $\mu\downarrow$ are opposite to each other in a position after that of the spin transfer electrode 210. Thus, it can be understood that the up-spin current $I\uparrow$ and the down-spin current $I\downarrow$ flow in opposite directions. Therefore, the sum of these currents ($=I\uparrow+I\downarrow$) becomes zero, and no current flows at any position located after the spin transfer electrode 210 in the positive direction. However, a spin current defined as $I\uparrow-I\downarrow$ flows. This current is called pure spin current.

The spin detection magnetic member 220 is electrically in contact with the nonmagnetic base electrode 200. Since the spin relaxation length $\lambda f$ in a magnetic material is generally very short, about a few nm to 10 nm, the up-spin electrons and the down-spin electrons are short-circuited in the magnetic material, and rapidly relaxed. Therefore, if the electrochemical potential distribution in the nonmagnetic base electrode 200 as shown in FIG. 2, down-spin electrons flow into the spin detection magnetic member 220, and up-spin electrons flow therefrom.

At this time, the value of majority carrier specific resistance $\rho^+$ of the spin detection magnetic member 220 differs from the value of minority carrier specific resistance $\rho^-$ thereof. Accordingly, the voltage at which the electrochemical potentials in the spin detection magnetic member 220 are relaxed (the voltage at which $\mu\uparrow=\mu\downarrow$) differs between a case where the magnetization of the spin injection magnetic member 210 and the magnetization of the spin detection magnetic member 220 are parallel to each other and a case where they are antiparallel to each other.

Figure 3:
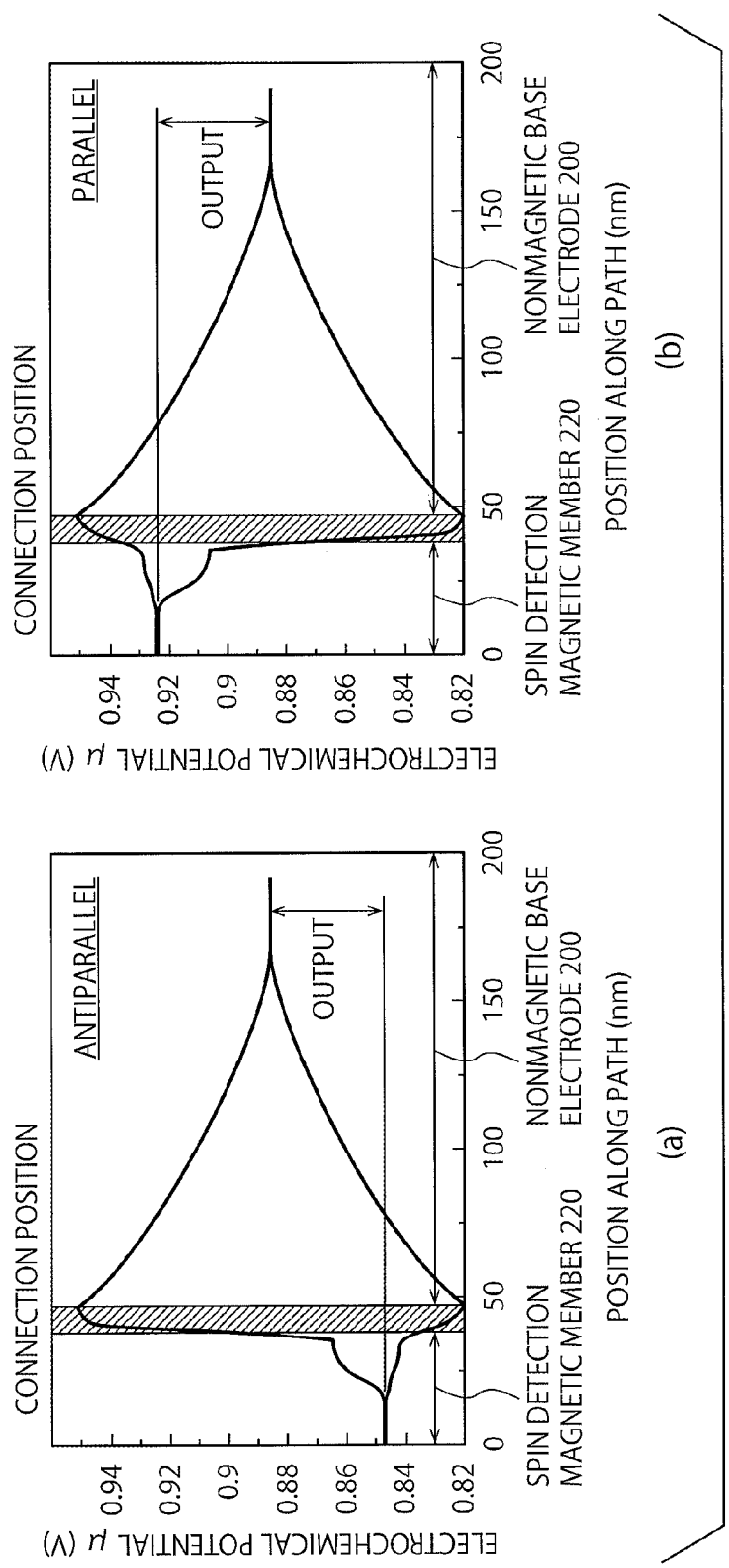
FIGS. 3(a) and 3(b) are diagrams each showing an example of electrochemical potential distributions along a path of a nonmagnetic base electrode in a common non-local spin valve element.

FIGS. 3(a) and 3(b) show examples of electrochemical potential distributions along a path from the spin detection magnetic member 220 to the nonmagnetic base electrode 200 in the cases where the magnetizations of the magnetic material 210 and the magnetization of the magnetic material 220 are parallel to each other and antiparallel to each other. The potential difference between the spin detection magnetic member 220 and the nonmagnetic base electrode 200 is the difference in electrochemical potential between the left end and the right end in each of FIGS. 3(a) and 3(b). It can be understood that the sign of the difference in the case where the magnetizations are parallel is opposite to that in the case where the magnetizations are antiparallel. Therefore, whether the two magnetizations are parallel or antiparallel to each other can be measured by measuring the voltage.

If the magnetizations of the two magnetic materials 210, 220 make an angle θ with each other, the potential difference therebetween is $V=(Vp+Vap)/2-Vs/2\cdot\cos\theta$ where the potential difference in the parallel case is Vp, the potential difference in the antiparallel case is Vap, and the difference therebetween is Vap−Vp=Vs. Therefore, the relative angle between the magnetizations of the two magnetic materials can be measured by measuring the potential difference. If, for example, one of the magnetic material forms a pinned layer (magnetization fixed layer), in which the magnetization is pinned by an antiferromagnetic material, and the other magnetic material forms a free layer (magnetization free layer), in which the magnetization is switched by an external magnetic field, a so-called spin vale structure can be obtained. This can be used as a magnetic sensor of a hard disk head or the like.

Figure 4:
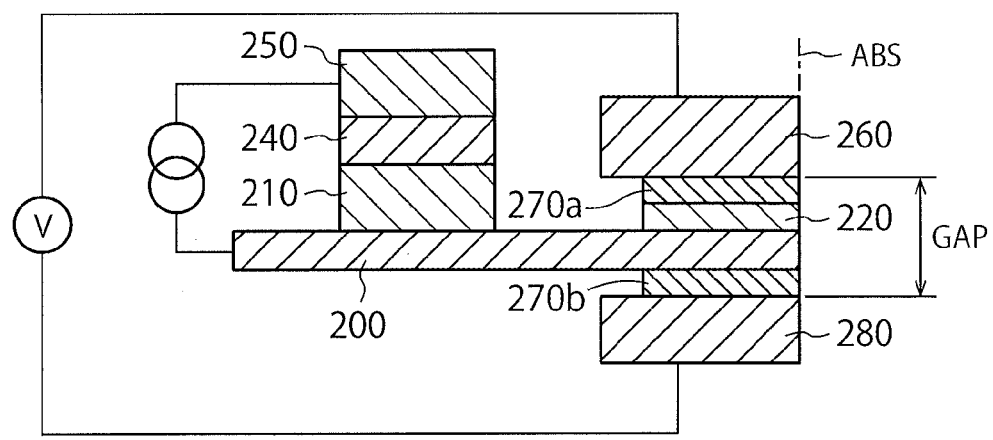
FIG. 4 is a cross-sectional view showing an example of a hard disk head including a common non-local spin valve element.

FIG. 4 shows an example of a hard disk head structure using a non-local spin valve element. The non-local spin valve element includes a first multilayer structure including a spin injection layer 210 of a magnetic material, an antiferromagnetic material 240, and a lead layer 250 stacked on a nonmagnetic base electrode 200 in this order, a second multilayer structure including a spin detection layer 220 of a magnetic material, a conductive layer 270a, and an upper magnetic shield 260 stacked in this order on the nonmagnetic base electrode 200, and a third multilayer structure including a conductive layer 270b and a lower magnetic shield 280 stacked in this order on the nonmagnetic base electrode 200. The first multilayer structure and the second multilayer structure are arranged on the same side of the nonmagnetic base electrode 200 so as to be separated from each other, and the third multilayer structure is arranged on an opposite side of the nonmagnetic base electrode 200 to the second multilayer structure. A sense current is caused to flow between the nonmagnetic base electrode 200 and the lead layer 250, and a voltage between the upper magnetic shield 260 and the lower magnetic shield 280 is measured. The distance between the upper magnetic shield 260 and the lower magnetic shield 280 is regarded as a gap therebetween. The end faces of the upper magnetic shield 260, the conductive layer 270a, the spin detection layer 220, the nonmagnetic base electrode 200, the conductive layer 270b, and the lower magnetic shield 280 are on the same plane. These end faces form an air bearing surface (ABS).

As compared to a common spin valve element having a multilayer structure including a magnetic material, a nonmagnetic material, a magnetic material, and an antiferromagnetic material, the total thickness of the non-local spin valve element shown in FIG. 4 is thinner since the spin injection layer 210 and the spin detection layer 220 can be arranged laterally. If the non-local spin valve element shown in FIG. 4 is used as a magnetic sensor in a hard disk head, only the free layer and the nonmagnetic base electrode are required to be exposed at the ABS. For this reason, the thickness can be reduced by the thicknesses of the antiferromagnetic material and the magnetization pinned layer. Accordingly, the distance (gap) between the shields can be reduced, and a hard disk head having a higher linear resolution can be provided.

As described above, a non-local spin valve element utilizes a feature that there is a difference between values of $\mu\uparrow$ and $\mu\downarrow$ due to the spin accumulation in a nonmagnetic base electrode. Therefore, the greater the spin accumulation in the nonmagnetic base electrode at the interface with the spin detection magnetic member is, the higher the detection output becomes. Accordingly, the spin relaxation length of the nonmagnetic base electrode is preferably as long as possible, and the distance between the spin injection magnetic member and the spin detection magnetic member is preferably as short as possible.

As a result of a detailed study of the junction between the spin injection magnetic member and the nonmagnetic base electrode, it is found, with respect to the electrochemical potential in the nonmagnetic base electrode, that if the ground position (where the external lead terminal is connected) of the nonmagnetic base electrode is at a distance of about the spin relaxation length $\lambda$n, from the junction, a higher spin accumulation can be obtained since the spin accumulation is not relaxed until the distance from the junction between the spin injection magnetic member and the nonmagnetic base electrode reaches about the spin relaxation length $\lambda$n. If there is a heterogeneous structure such as a junction to an external lead terminal or a material having a shorter spin relaxation length at a distance that is shorter than the spin relaxation length $\lambda$n, the spin relaxation may be accelerated thereby, and the spin accumulation may be reduced.

Figure 5:
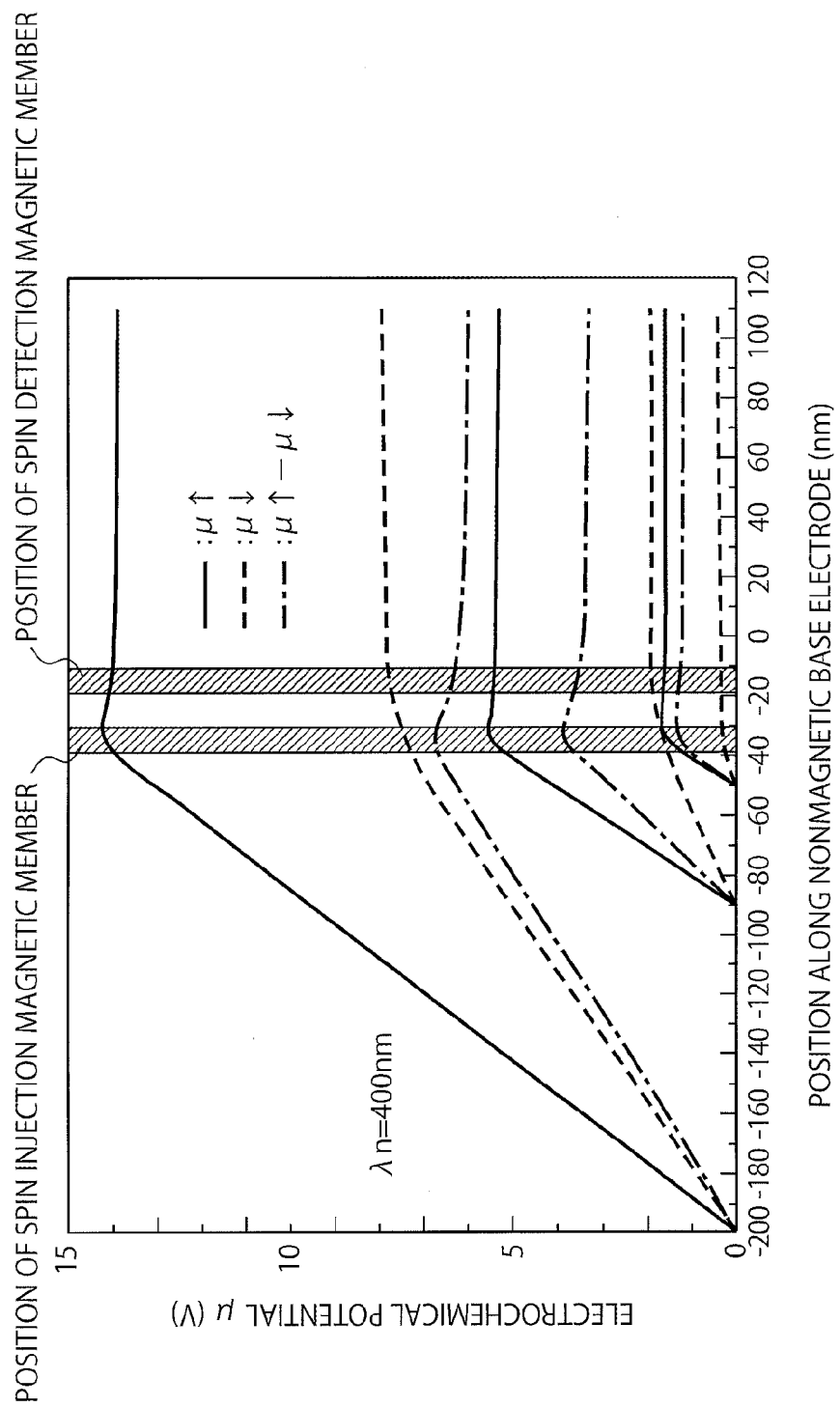
FIG. 5 is a diagram showing examples of electrochemical potential distributions each with a different length between a spin injection magnetic member and a ground position of a nonmagnetic base electrode in a common non-local spin valve element.

FIG. 5 shows examples of electrochemical potential distributions in cases where the distance between the spin injection magnetic member and the ground position (where an external lead terminal is connected) of the nonmagnetic base electrode is varied. As can be understood from FIG. 5, the spin accumulation becomes greater if the aforementioned distance becomes longer to about the spin relaxation length $\lambda$n.

Furthermore, as a result of a detailed study of the junction between the spin detection magnetic member and the nonmagnetic base electrode, it is found that the ground position (where an external lead terminal is connected) is preferably located at a distance of a few times the spin relaxation length $\lambda$n from the junction between the spin injection magnetic member and the nonmagnetic base electrode since the spin accumulation is not relaxed before the position at a distance of a few times the spin relaxation length $\lambda$n from the junction between the spin injection magnetic member and the nonmagnetic base electrode, and the spin accumulation does not become $\mu\uparrow=\mu\downarrow$. If there is a heterogeneous structure such as a junction to an external lead terminal or a material having a shorter spin relaxation length at a distance that is shorter than such a length, the spin accumulation may be reduced, and noises may be caused.

Figure 6:
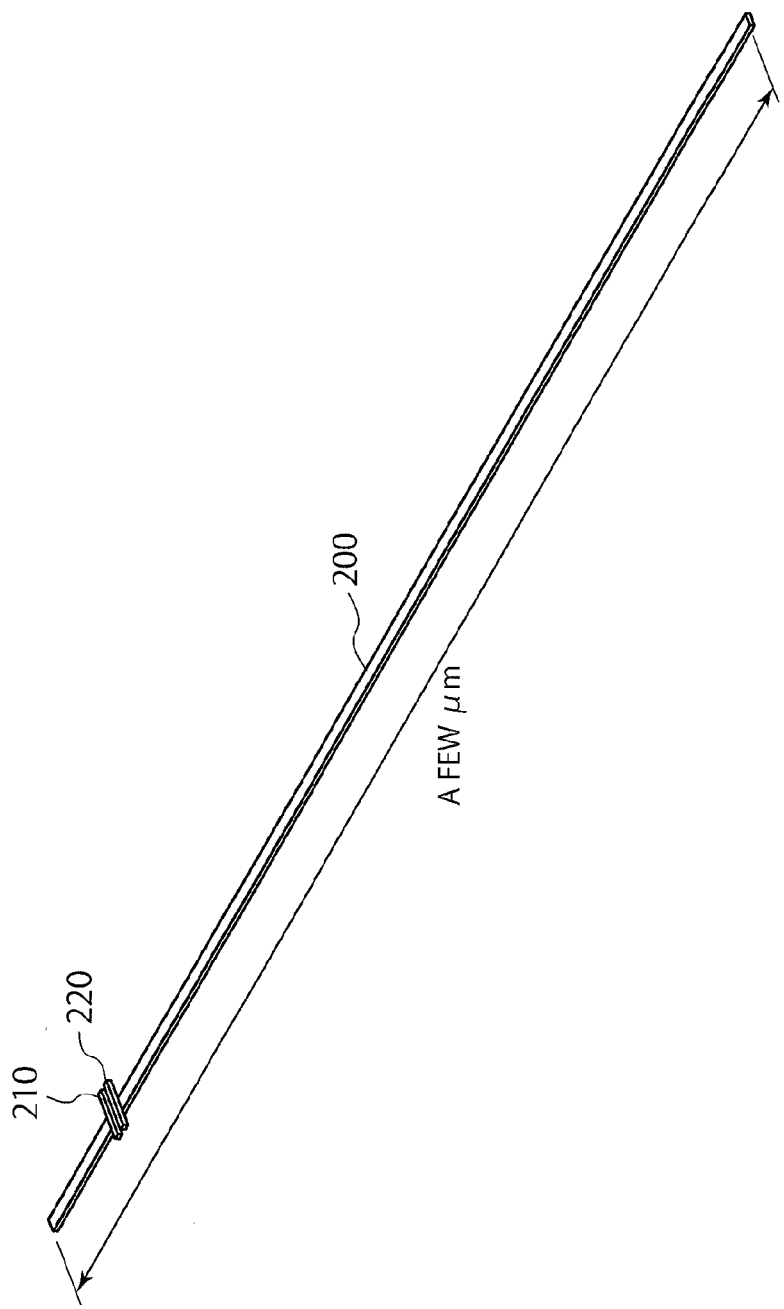
FIG. 6 is a diagram for explaining a required size of a common non-local spin valve element.

As described above, the dimensions of the spin injection magnetic member and the spin detection magnetic member of a non-local spin valve element can be satisfactorily reduced so as to be in a rectangular shape having, for example, a width of 10 nm, a length of 10 nm, and a thickness of 5 nm to be used for a high-density hard disk head. However, even in such a case, the nonmagnetic base electrode 200 should have a length sufficiently longer than the spin relaxation length $\lambda$n. As shown in FIG. 6, the entire length of the non-local spin valve element should be a few μm.

For this reason, the freedom in design is limited, and heterogeneity or defects may arise in somewhere in the nonmagnetic base electrode having a length of a few μm. If a contact to an external lead terminal is provided within the length of a few μm, such a contact exerts an influence to the spin accumulation, and the element tends to receive disturbance such as degradation of output characteristics, and becomes hard to manufacture.

Figure 7:
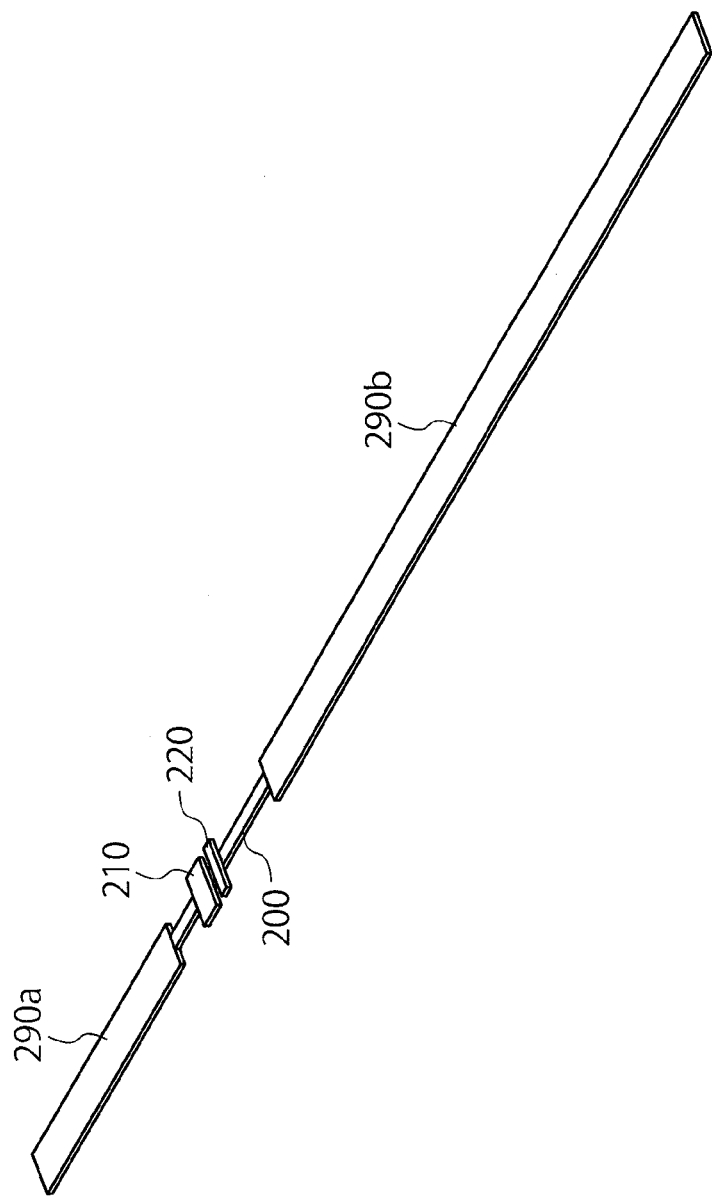
FIG. 7 is a diagram showing an example of a non-local spin valve element, to which external lead terminals are connected.

In order to describe the aforementioned feature in more detail, a structure in which external lead terminals 290a, 290b are located near the spin injection magnetic material 210 and the spin detection magnetic member 220 as shown in FIG. 7 is studied.

Figure 8:
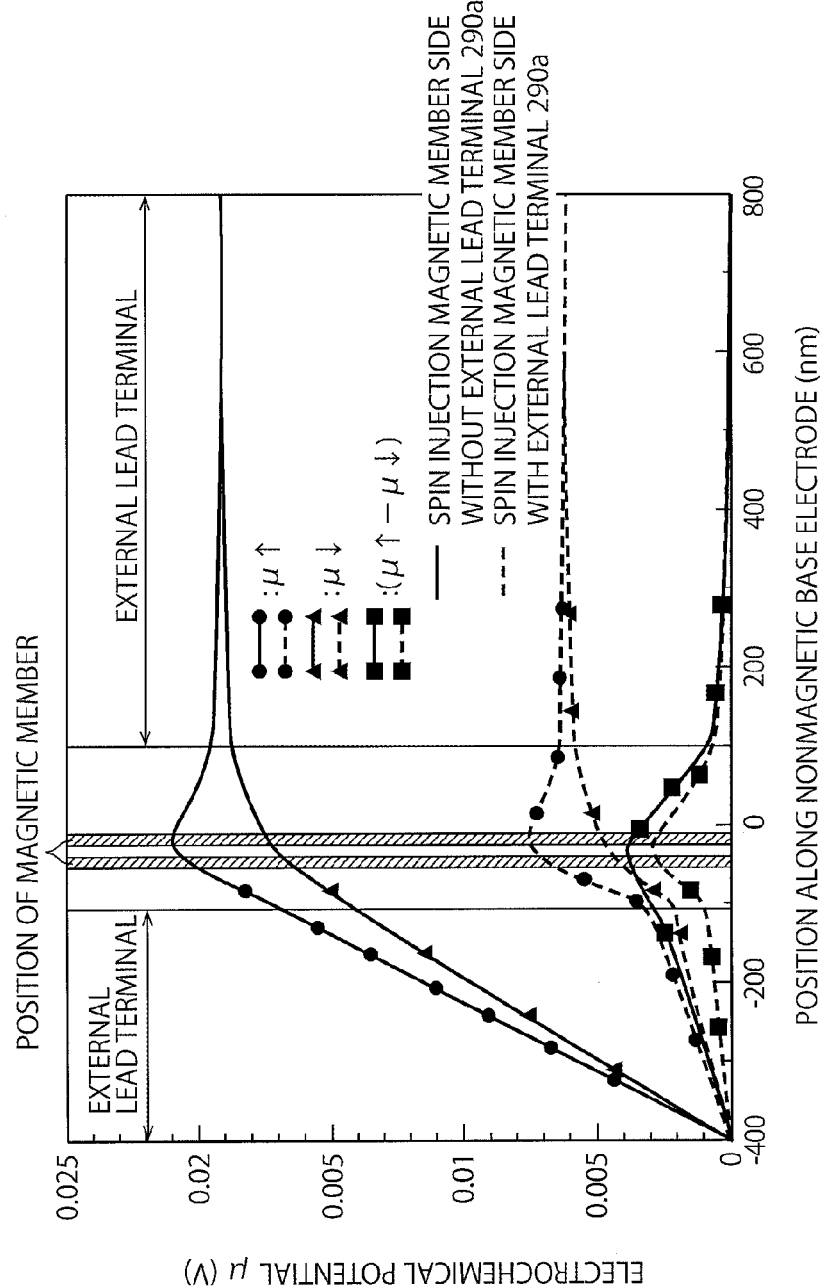
FIG. 8 is a diagram showing examples of electrochemical potential distributions, in cases where an external lead terminal is present and not present on the spin injection magnetic member side.

FIG. 8 shows examples of electrochemical potential distributions in cases where the external lead terminal 290a is located near the spin injection magnetic member 210 and where it is not located near the spin injection magnetic member 210. As can be understood from FIG. 8, when the external lead terminal 290a is located near the spin injection magnetic member 210, the spin accumulation is reduced.

Figure 9:
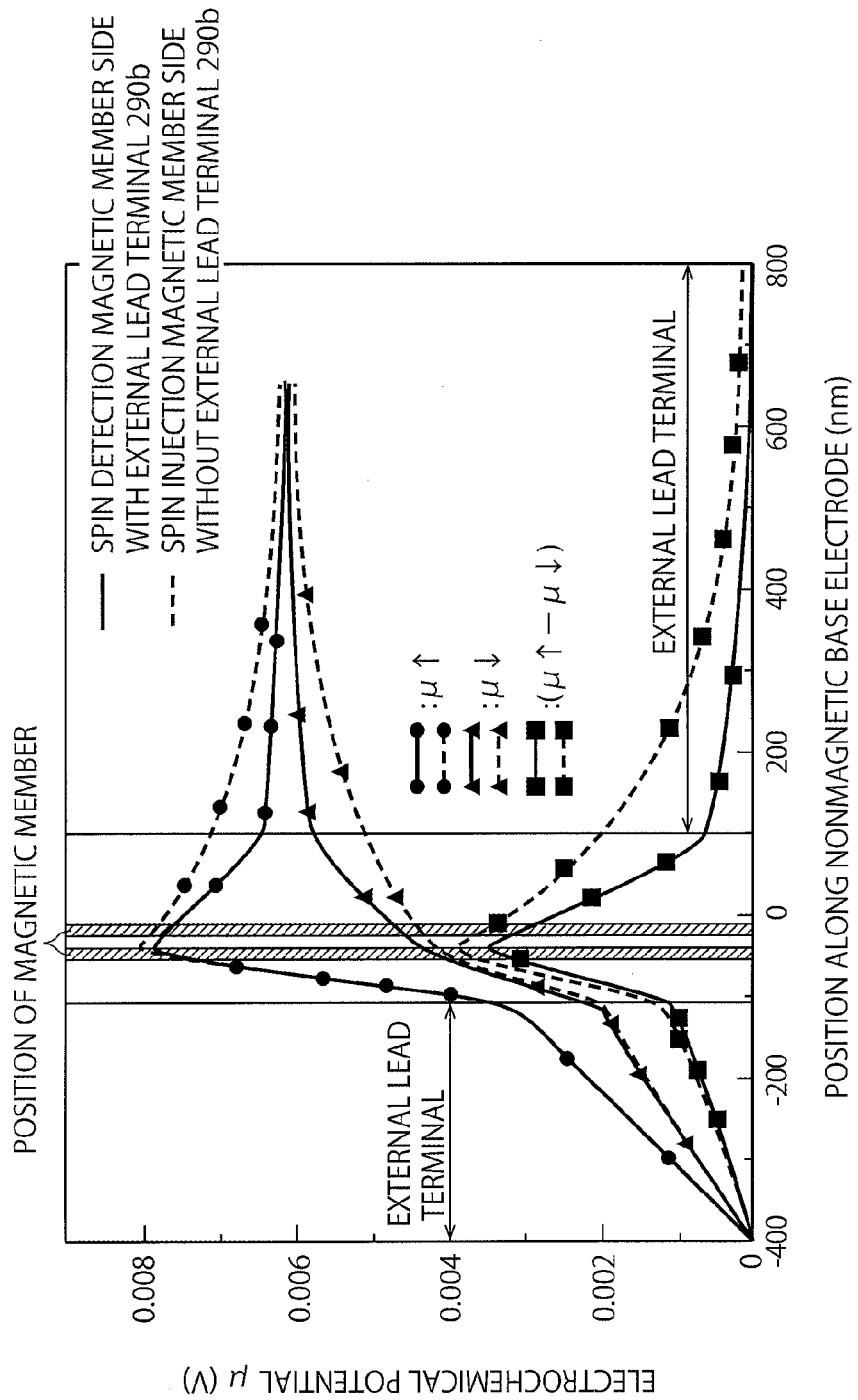
FIG. 9 is a diagram showing examples of electrochemical potential distributions, in cases where an external lead terminal is present and not present on the spin injection magnetic member side.

FIG. 9 shows examples of electrochemical potential distribution for cases where the external lead terminal 290b is located near the spin detection magnetic member 220 and where it is not located near the spin detection magnetic member 220. As can be understood from FIG. 9, when the external lead terminal 290b is located near the spin detection magnetic member 220, the spin accumulation is reduced.

Thus, it is found that a common non-local spin valve element tends to be subjected to the influence of disturbance, such as the degradation of output characteristics caused by the position of connecting external lead terminals.

Furthermore, since the above described common non-local spin valve element has a four-terminal structure, four external lead terminals are needed. This means that the number of terminals is twice that of conventional two-terminal spin valve elements. This causes a problem in that drawing out a terminal from a non-local spin valve element located at an ABS of a head is difficult. In the case of the two-terminal element, the upper lower magnetic shield can be used as an external lead terminal. Therefore, the manufacture of such elements is relatively easy. However, a four-terminal element requires two additional external lead terminals. Therefore, the process to manufacture such elements becomes complicated, which leads to the degradation of yield, and the increase in costs.

In order to deal with this problem, JP 2012-234602A discloses a three-terminal, non-local spin valve element. The structure proposed in JP 2012-234602A includes a common terminal serves as both a terminal for applying a current on the nonmagnetic base electrode side and a terminal for detecting a voltage on the nonmagnetic base electrode side, by which a three-terminal structure is achieved.

However, in order to have a sufficient spin accumulation in the nonmagnetic base electrode by this method, the position of the common terminal should be located at a distance of a few times the spin relaxation length $\lambda n$ from the spin injection magnetic member and the spin detection magnetic member. Therefore, the size of the nonmagnetic base electrode is needed to be increased to about a few μm. Accordingly, the problems that the freedom of design of the element is limited, and the element tends to be subjected to external disturbance are not eliminated. Furthermore, since the length of the nonmagnetic base electrode should be increased, the element resistance is increased, and the signal-to-noise ratio is degraded. Moreover, since the length of the nonmagnetic base electrode should be increased, and a sense current with a large current density should be caused to flow therethrough, the possibility of the occurrence of such problems as an increase in temperature and electromigration is increased.

The present inventors have studied hard to obtain a three-terminal, non-local spin valve element which can be used in a hard disk head for reading data from a hard disk drive with minute recording bits, capable of reducing the size, and unlikely to be affected by external environment. Some embodiments of such a three-terminal, non-local spin valve element will be described below with reference to the accompanying drawings.

(First Embodiment)

Figure 10:
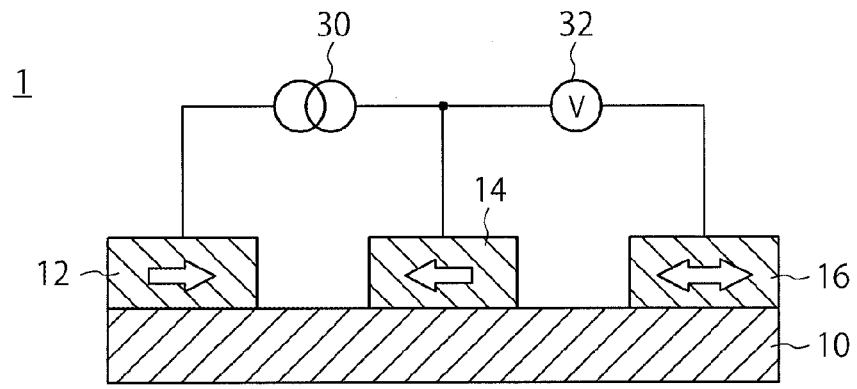
FIG. 10 is a diagram showing an example of a three-terminal, non-local spin valve element according to the first embodiment.

FIG. 10 shows a three-terminal, non-local spin valve element according to the first embodiment. The three-terminal, non-local spin valve element 1 according to the first embodiment includes a nonmagnetic base layer (nonmagnetic base electrode) 10, and a spin injection terminal 12, a ground terminal 14, and a spin detection terminal 16 arranged to be separated from each other on the nonmagnetic base layer 10 along the direction in which the nonmagnetic base layer 10 extends. Each of the spin injection terminal 12, the ground terminal 14, and the spin detection terminal 16 includes a magnetic layer. In the first embodiment, the ground terminal 14 is located between the spin injection terminal 12 and the spin detection terminal 16. Furthermore, the spin injection terminal 12, the ground terminal 14, and the spin detection terminal 16 are located on a surface on the same side of the nonmagnetic base layer 10. Incidentally, the spin injection terminal 12 and the ground terminal 14 are located within a distance that is satisfactorily shorter than the spin relaxation length $\lambda n$ of the nonmagnetic base electrode 10.

The spin injection terminal 12 includes a magnetic layer in which the direction of magnetization is pinned. The ground terminal 14 includes a magnetic layer in which the direction of magnetization is pinned. The direction of magnetization in this magnetic layer is antiparallel to the direction of magnetization in the magnetic layer of the spin injection terminal 12. The spin detection terminal 16 includes a magnetic layer, in which the direction of magnetization is switchable. This means that the direction of magnetization can be changed in accordance with an external magnetic field.

External lead terminals (not shown) are connected to the magnetic layers of the spin injection terminal 12 and the ground terminal 14, and also connected to a current source 30 to pass a sense current. Furthermore, an external lead terminal (not shown) is connected to the magnetic layer of the spin detection terminal 16. The external lead terminal of the spin detection terminal 16 and the external lead terminal of the ground terminal 14 are connected to a voltmeter 32 where a voltage between the external lead terminals is measured. Thus, the non-local spin valve element according to the first embodiment has a three-terminal structure in which the ground terminal 14 is shared by the current source 30 and the voltmeter 32.

A sense current flows through the nonmagnetic base electrode 10 via the spin injection terminal 12 and the ground terminal 14. The sense current enters through the magnetic layer connected to one of the above two terminals, and exits through the magnetic layer connected to the other. A spin-polarized current flows through the nonmagnetic base electrode 10 at this time since the electric resistance in the magnetic layer differs between majority spin electrons and minority spin electrons. The electrochemical potential of conduction electrons in the nonmagnetic base electrode 10 differs between up-spin electrons and down-spin electrons.

Figure 11:
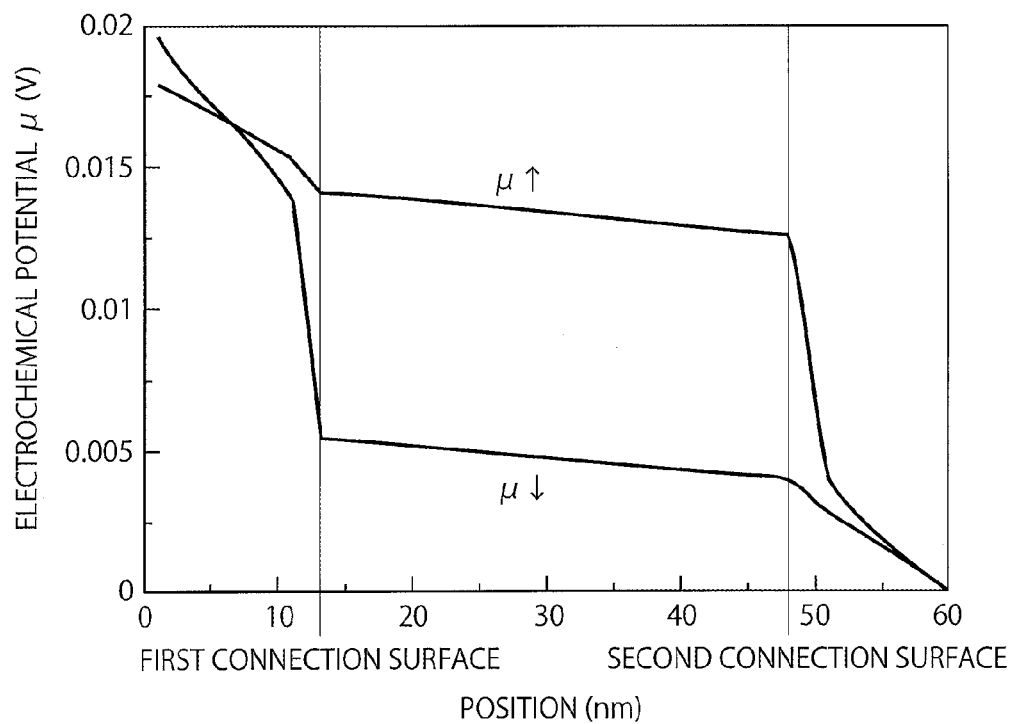
FIG. 11 is a diagram showing an example of electrochemical potential distributions along paths of up-spin electrons and down-spin electrons in the three-terminal, non-local spin valve element according to the first embodiment.

FIG. 11 shows the plotting of electrochemical potentials $\mu\uparrow, \mu\downarrow$ of up-spin electrons and down-spin electrons along the path of the sense current. In this example, the voltage of the magnetic layer of the ground terminal 14 is set at 0 V, and the voltage of the magnetic layer of the spin injection terminal 12 is set at a positive voltage. The path of the sense current shown in FIG. 11 is from the top surface (the connection surface between the external lead terminal and the spin injection terminal 12) through the spin injection terminal 12, a first connection surface at which the spin injection terminal is connected to the nonmagnetic base electrode 10, the nonmagnetic base electrode 10, a second connection surface at which the ground terminal 14 is connected to the nonmagnetic base electrode 10, the ground terminal 14, and the top surface of the ground terminal 14 (the connection surface between the ground terminal 14 and the external lead terminal). Therefore, both the up-spin current I↑ and the down-spin current I↓ flow from the spin injection terminal 12 to the nonmagnetic base electrode 10, and then from the nonmagnetic base electrode 10 to the ground terminal 14.

In the first embodiment, the magnetization direction of the magnetic layer of the spin injection terminal 12 and the magnetization direction of the magnetic layer of the ground terminal 14 are antiparallel to each other. Accordingly, spin accumulation for increasing the up-spin current $\mu\uparrow$ occurs at both the first connection surface between the spin injection terminal 12 and the nonmagnetic base electrode 10 and the second connection surface between the ground terminal 14 and the nonmagnetic base electrode 10. Furthermore, since the distance between the spin injection terminal 12 and the ground terminal 14 is satisfactorily shorter than the spin relaxation length $\lambda n$ of the nonmagnetic base electrode 10, constant and great spin accumulation occurs between the first connection surface and the second connection surface in the nonmagnetic base electrode 10 regardless of the location in the nonmagnetic base electrode 10.

In the first embodiment, the electrochemical potential $\mu\uparrow$ of up-spin electrons and the electrochemical potential $\mu\downarrow$ of down-spin electrons can be separated from each other in a short distance within the magnetic material by utilizing the short spin diffusion length in the magnetic material. Accordingly, it is not necessary to keep the spin relaxation length $\lambda n$ that is required when an external lead terminal is directly connected to a nonmagnetic base electrode in conventional devices. Therefore, the nonmagnetic base electrode 10 can be shortened.

Figure 12:
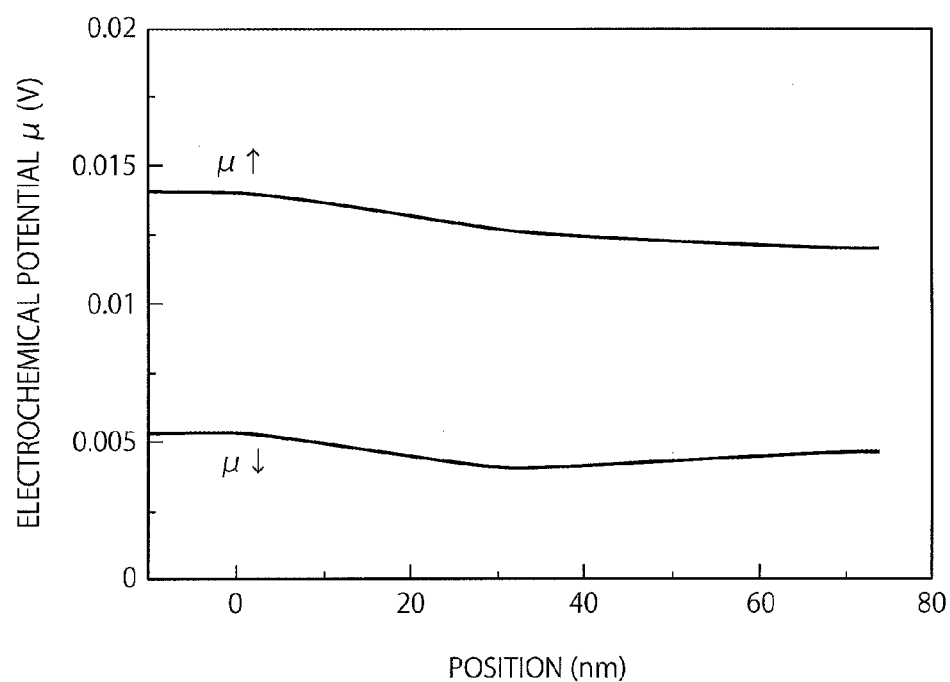
FIG. 12 is a diagram showing electrochemical potential distributions along the center line of nonmagnetic base layer of the three-terminal, non-local spin valve element according to the first embodiment.

FIG. 12 shows electrochemical potential distributions along the center line of the nonmagnetic base electrode 10. In the first embodiment, the length of the nonmagnetic base electrode 10 can be considerably shorter than the spin relaxation length $\lambda n$. Accordingly, the spin accumulation does not have a large distribution over the entire nonmagnetic base electrode 10, but becomes constant and large.

The spin detection terminal 16 is electrically in contact with the nonmagnetic base layer 10. In general, the spin relaxation length $\lambda f$ in a magnetic material is very short, a few nm to a few tens nm. Accordingly, up-spin electrons and down-spin electrons are short-circuited in a magnetic material. Therefore, if the electrochemical potentials in the nonmagnetic base electrode 10 have distributions shown in FIG. 12, down-spin electrons flow into the spin detection terminal 16, and up-spin electrons flow out of the spin detection terminal 16. At this time, since the value of the majority carrier specific resistance $\rho^+$ of the spin detection terminal 16 differs from that of the minority carrier specific resistance $\rho^-$, the voltage to which the electrochemical potential is relaxed in the spin detection terminal 16 differs between the case where the magnetization of the spin injection terminal 12 and that of the spin detection terminal 16 are parallel to each other and the case where the magnetizations are antiparallel to each other.

Figure 13:
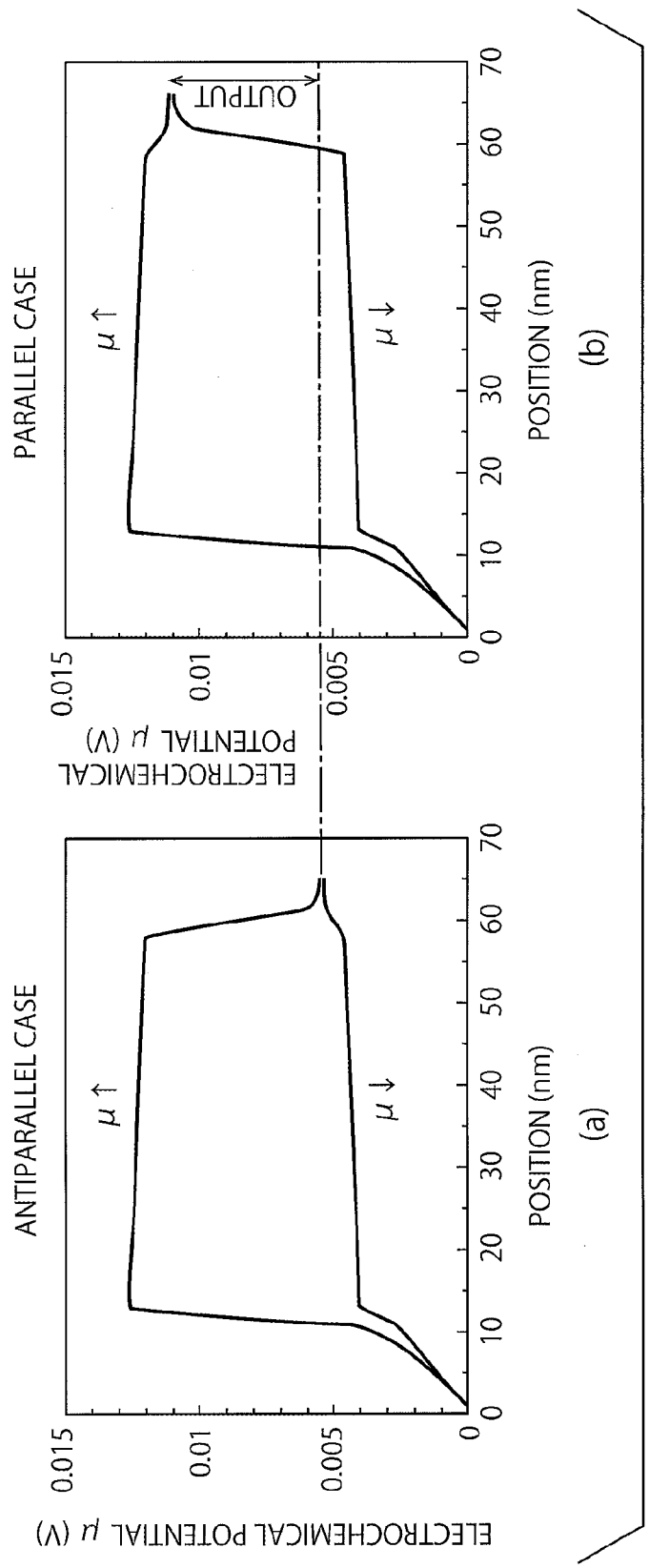
FIGS. 13(a) and 13(b) are diagrams showing examples of electrochemical potential distributions along the path of the three-terminal, non-local spin valve element according to the first embodiment.

FIGS. 13(a) and 13(b) show examples of electrochemical potential distributions along the path from the ground terminal 14 through the nonmagnetic base electrode 10 to the spin detection terminal 16 in the cases where the two magnetizations are antiparallel to each other and parallel to each other. In the case where the magnetizations are parallel to each other, the electrochemical potentials are relaxed to a higher voltage level, and in the case where they are antiparallel to each other, the electrochemical potentials are relaxed to a lower voltage level. Therefore, whether the two magnetizations are parallel or antiparallel to each other can be measured by measuring the voltage level.

If the magnetization of the magnetic layer in the spin injection terminal 12 has an angle $\theta$ with the magnetization of the magnetic layer in the spin detection terminal 16, the potential difference meets the equation $V=(Vp+Vap)/2-Vs/2\cdot\cos\theta$ where Vp is the potential difference in the case where the magnetizations are parallel to each other, Vap is a potential difference in the case where the magnetizations are antiparallel to each other, and Vs is a difference therebetween (Vap−Vp=Vs). Accordingly, a relative angle between the magnetization of the magnetic layer in the spin injection terminal 12 and the magnetization of the magnetic layer in the spin detection terminal 16 can be measured by measuring the potential difference. Therefore, the three-terminal, non-local spin valve element 1 according to the first embodiment can be used as a magnetic sensor of a hard disk head or the like.

Since a longer spin relaxation length $\lambda n$ can make a greater spin accumulation, a material having a longer spin relaxation length, such as Cu, Ag, or Au, is preferably used to form the nonmagnetic base electrode 10.

The materials to form the magnetic layers of the spin injection terminal 12, the ground terminal 14, and the spin detection terminal 16 preferably have a great difference between the majority carrier specific resistance $\rho^+$ and the minority carrier specific resistance $\rho^-$, such as CoFe and CoFeB. More preferably, a half metal, which includes majority carriers but substantially no minority carriers, is preferably used. A Heusler alloy-based $Co_2Fe(Ge_{0.5}Ga_{0.5})$ or $Co_2Mn(Ge_{0.5}Ga_{0.5})$ can be used as the half metal, but any other half metal can also be used. The terminals 12, 14, 16 may be directly connected to the nonmagnetic base electrode 10, and also may be connected through tunnel junction with a tunnel barrier being interposed, like the structure CoFe/MgO (1 nm)/Cu. Here, MgO (1 nm) means MgO having a thickness of 1 nm.

The magnetization of the magnetic layer in each of the spin injection terminal 12 and the ground terminal 14 can be pinned by stacking an antiferromagnetic layer so as to contact the magnetic layer to apply a one-directional anisotropy thereto. PtMn or IrMn may be used to form the antiferromagnetic layer. The magnetic layer, in which the magnetization is to be pinned, may have a so-called synthetic structure in which a material is interposed between upper and lower magnetic layers for helping antiferromagnetic coupling of the magnetic materials of the upper and lower magnetic layers, as in the structure CoFe/Ru/CoFe. Such a synthetic structure enables a storing magnetization pinning.

Figure 14:
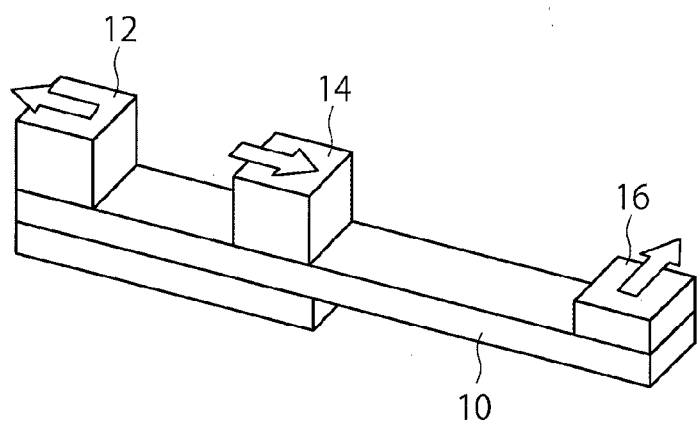
FIG. 14 is a diagram showing an example of magnetization orientations in a case where a hard disk head is formed by using the three-terminal, non-local spin valve element according to the first embodiment.

FIG. 14 shows the magnetization orientation in a case where a hard disk head is formed by using the non-local spin valve element 1 according to the first embodiment. When the non-local spin valve element 1 is used in a hard disk head, the magnetization of the magnetic layer in the spin injection terminal 12 and the magnetization of the magnetic layer in the ground terminal 14 are preferably pinned to be antiparallel to each other by using antiferromagnetic layers, and a bias magnetic field is preferably applied by using a hard bias layer to the magnetic layer of the spin detection terminal 16 so that the magnetization thereof is perpendicular to the magnetizations in the spin injection terminal 12 and the ground terminal 14.

Figure 15:
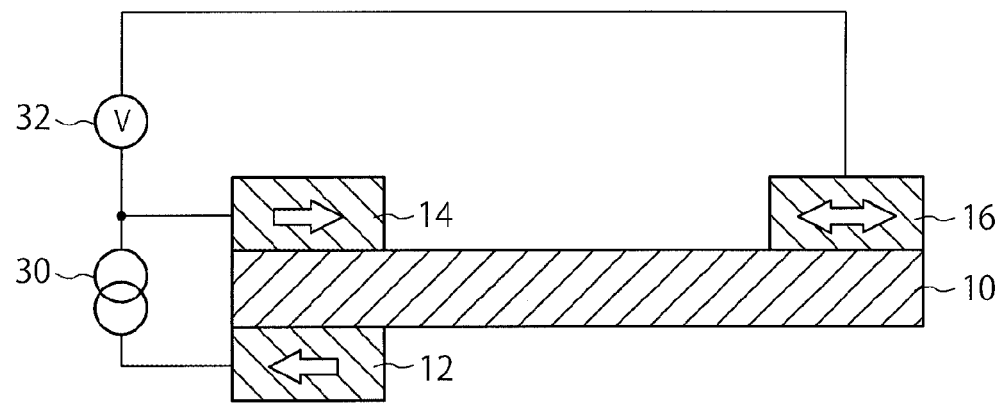
FIG. 15 is a diagram showing an example of a three-terminal, non-local spin valve element according to a modification of the first embodiment.

Incidentally, the spin injection terminal 12, the ground terminal 14, and the spin detection terminal 16 of the non-local spin valve element 1 shown in FIG. 10 are located so as to be separated from each other on the same side of the nonmagnetic base electrode 10 along the direction in which the nonmagnetic base electrode 10 extends. However, the spin injection terminal 12 may be located on the opposite side to the ground terminal 14 relative to the nonmagnetic base electrode 10 as shown in FIG. 15.

Furthermore, as will be described later, the spin detection terminal 16 of the non-local spin valve element 1 shown in FIG. 10 may be located on the opposite side of the nonmagnetic base electrode 10 to the spin injection terminal 12 and the ground terminal 14.

As described above, according to the first embodiment, a three-terminal, non-local spin valve element can be obtained, which may be used in a hard disk head for reading data from a hard disk device with minute recording bits, easy to be downsized, and hard to be affected by external environment.

(Second Embodiment)

Figure 16:
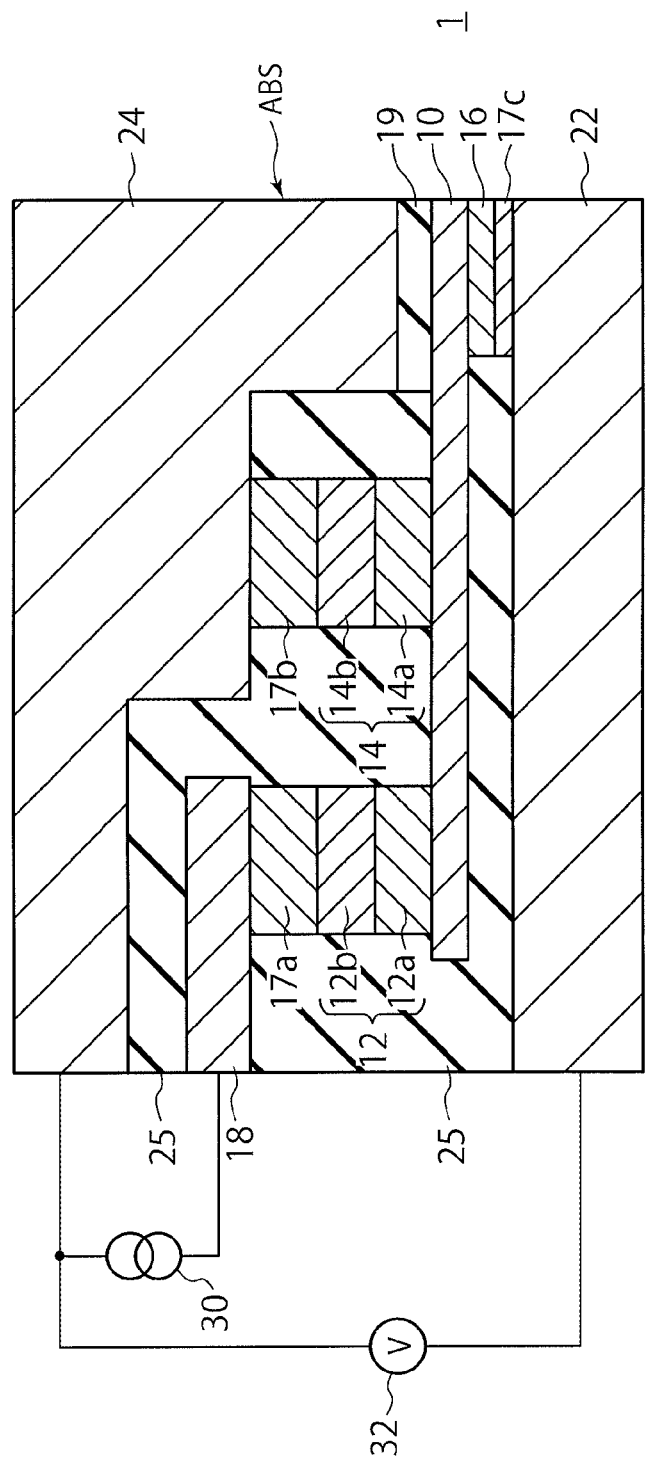
FIG. 16 is a cross-sectional view showing a hard disk head according to the second embodiment.

FIG. 16 shows a hard disk head according to the second embodiment. The hard disk head according to the second embodiment uses the non-local spin valve element 1 according to the first embodiment as a magnetic sensor. The hard disk head according to the second embodiment includes the non-local spin valve element 1 according to the first embodiment, a lower magnetic shield 22, and an upper magnetic shield 24. The non-local spin valve element 1 includes a nonmagnetic base electrode 10, and a spin injection terminal 12, a ground terminal 14, and a spin detection terminal 16, which are disposed on the nonmagnetic base electrode 10 so as to be separated from each other. In the second embodiment, the spin injection terminal 12 and the ground terminal 14 are disposed on the same side of the nonmagnetic base electrode 10, and the spin detection terminal 16 is disposed near one of the terminals of the nonmagnetic base electrode 10 on an opposite side of the nonmagnetic base electrode 10 to the spin injection terminal 12 and the ground terminal 14.

The spin injection terminal 12 includes a magnetization pinned layer 12a and an antiferromagnetic layer 12b disposed on the magnetization pinned layer 12a to pin the magnetization direction of the magnetization pinned layer 12a. A lead terminal 17a is disposed on the antiferromagnetic layer 12b.

The ground terminal 14 includes a magnetization pinned layer 14a and an antiferromagnetic layer 14b disposed on the magnetization pinned layer 14a to pin the magnetization direction of the magnetization pinned layer 14a. A lead terminal 17b is disposed on the antiferromagnetic layer 14b.

A lead terminal 17c is disposed under the spin detection terminal 16, the lead terminal 17c connecting to the lower magnetic shield 22. An insulating layer 19 for forming a gap is disposed on a region of the nonmagnetic base electrode 10 immediately above the spin detection terminal 16, so that the nonmagnetic base electrode 10 and the magnetic shield 24 are electrically insulated from each other in this region. The lead terminal 17b is connected to the upper magnetic shield 24. The lower magnetic shield 22 includes a first portion connecting to the lead terminal 17c, and a second portion connecting to the first portion and extending in the direction along the nonmagnetic base electrode 10. The upper magnetic shield 24 includes a first portion connecting to the lead terminal 17b on the ground terminal 14, a second portion connecting to the first portion and extending along the ABS, and a third portion connecting to the first portion and located above an external lead terminal 18.

The end face of the nonmagnetic base electrode 10 where the spin detection terminal 16 is disposed, the side surface of the spin detection terminal 16 opposite to the ground terminal 14, and the side surfaces of the lower magnetic shield 22 and the upper magnetic shield 24 opposite to the ground terminal 14 are on the same plane, which is the ABS.

The upper magnetic shield 24 and the external lead terminal 18 are connected to a current source 30, and the lower magnetic shield 22 and the upper magnetic shield 24 are connected to a voltmeter 32. As a result, a sense current flows between the spin injection terminal 12 and the ground terminal 14, and a voltage between the ground terminal 14 and the spin detection terminal 16 is measured via the nonmagnetic base electrode 10.

An insulating layer 25 of, for example, alumina, is formed between the non-local spin valve element 1 and the lower magnetic shield 22 and between the non-local spin valve element 1 and the upper magnetic shield 24 to prevent unnecessary electric contact.

(Modification)

Figure 17:
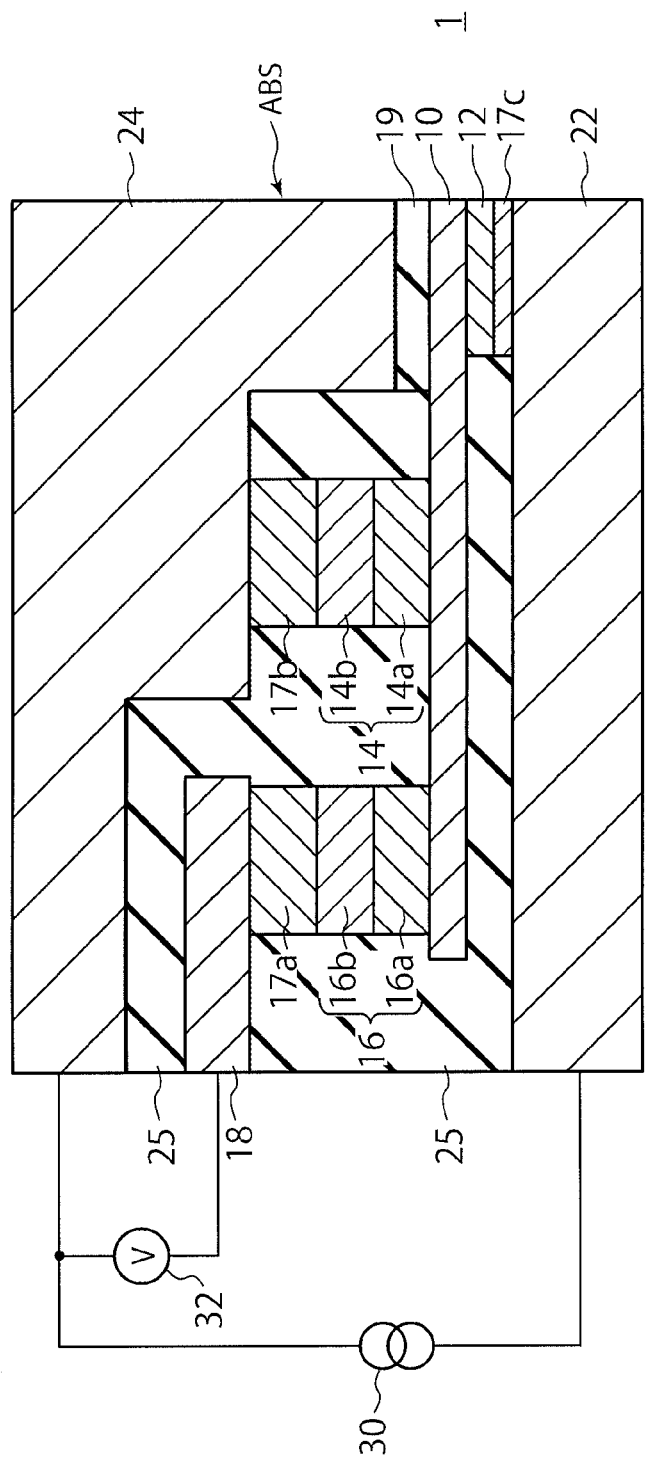
FIG. 17 is a cross-sectional view showing a hard disk head according to a modification of the second embodiment.

FIG. 17 shows a hard disk head according to a modification of the second embodiment. The hard disk head according to the modification is obtained by replacing the positions of the spin injection terminal 12 and the spin detection terminal 16, and using the magnetic layers 16a, 14a of the spin detection terminal 16 and the ground terminal 14 as magnetization pinned layers and the magnetic layer of the spin injection terminal 12 as a free layer in the hard disk head shown in FIG. 16. In this case, the magnetization directions of the magnetic layers 16a, 14a in the spin detection terminal 16 and the ground terminal 14 are pinned to be parallel to each other. The current source 30 is connected to the lower magnetic shield 22 and the upper magnetic shield 24, and the voltmeter 32 is connected to the external lead terminal 18 and the upper magnetic shield 24.

In the modification, the angle formed by the magnetization of the magnetization pinned layers 16a, 14a of the spin detection terminal 16 and the ground terminal 14 and the magnetization of the magnetic layer of the spin injection terminal 12 serving as a free layer varies in accordance with an external magnetic field. As the angle becomes closer to the antiparallel direction, the spin accumulation of the nonmagnetic base electrode 10 increases, and as it becomes closer to the parallel direction, the spin accumulation decreases. Therefore, the voltage of the spin detection terminal 16 varies. The degree of the external magnetic field can be detected using this feature. In the arrangement shown in FIG. 17, the magnetizations of the magnetization pinned layers 16a, 14a in the spin detection terminal 16 and the ground terminal 14 are not needed to be antiparallel to each other. Accordingly, the head can be manufactured more easily.

EXAMPLE 1

Figure 18:
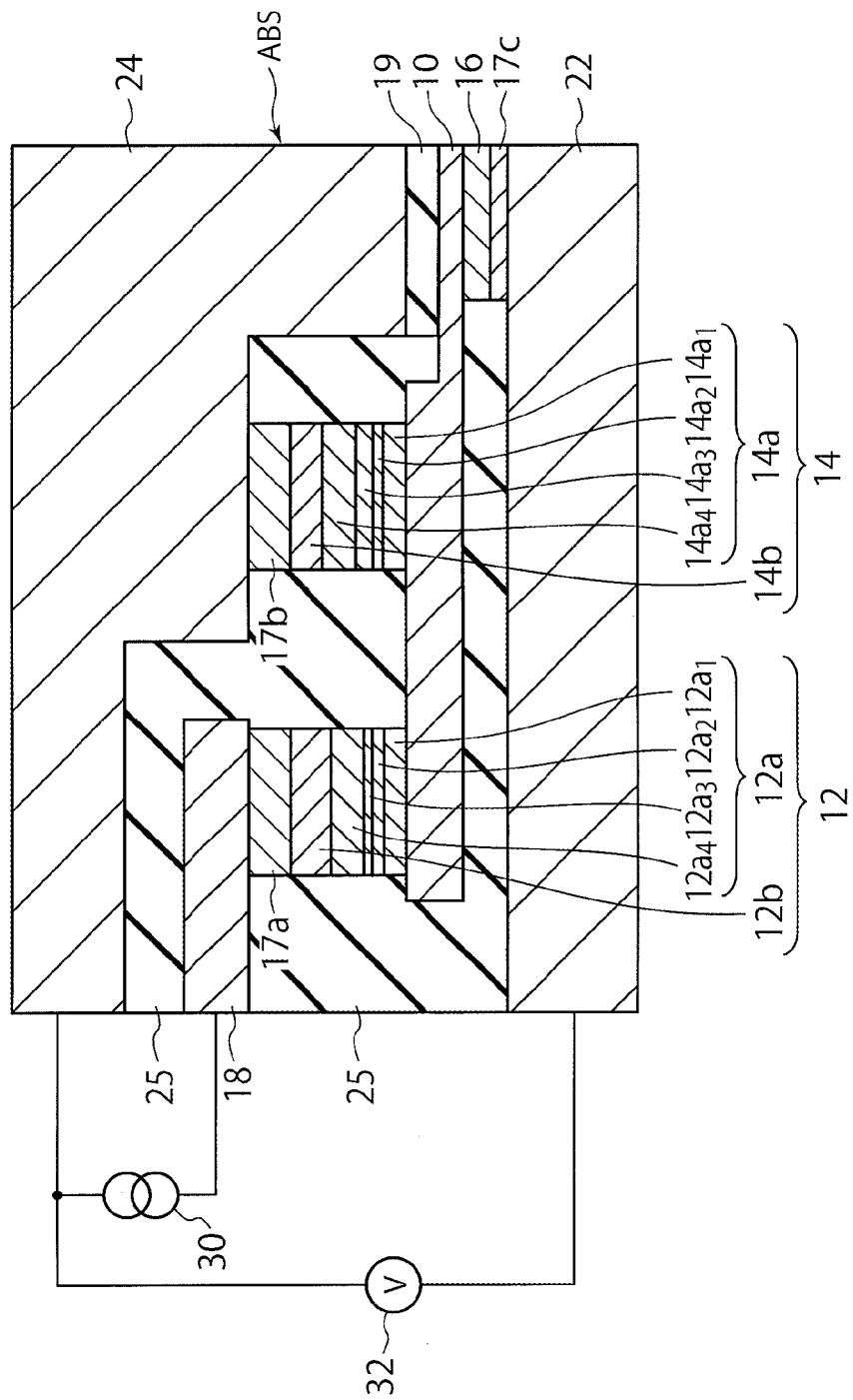
FIG. 18 is a cross-sectional view showing a hard disk head according to Example 1.

FIG. 18 shows a hard disk head according to Example 1. The hard disk head according to Example 1 is the hard disk head according to the second embodiment, which is manufactured in the following manner.

First, a layer of $Co_2Fe(Ge_{0.5}Ga_{0.5})$ Heusler alloy ("CFGG"), which is a half metal, is formed as the spin detection terminal 16 by a sputtering method on the lower magnetic shield 22 with the lead terminal 17c of Cu having a thickness of 2 nm interposed therebetween. The dimensions of the spin detection terminal 16 are 5 nm in thickness, 12 nm in width (extending in the direction parallel to the ABS), and 10 nm in length (extending in the direction perpendicular to the ABS). A gap film 25 of alumina is formed to surround the spin detection terminal 16. The nonmagnetic base electrode 10 formed on the gap film 25 and the lower magnetic shield 22 are arranged so as not to be in contact with each other unnecessarily. Then, a layer of Cu to serve as the nonmagnetic base electrode 10 is formed to overlap the spin detection terminal 16 by a sputtering method in two steps to have a length of 100 nm, a width of 12 nm, and a thickness of 10 nm from the connection surface with the spin injection terminal 12 to the connection surface with the ground terminal 14, and the same length and width and a thickness of 5 nm from the connection surface with the ground terminal 14 to the connection surface with the spin detection terminal 16.

Subsequently, the spin injection terminal 12 and the ground terminal 14 are formed by a sputtering method on the nonmagnetic base electrode 10. The magnetization pinned layer 12a of the spin injection terminal 12 has a synthetic structure including a spacer of Ru. Specifically, the spin injection terminal 12 has a multilayer structure in which a CFGG layer $12a_1$ having a thickness of 5 nm, a CoFe layer $12a_2$ having a thickness of 1 nm, a Ru layer $12a_3$ having a thickness of 1 nm, a CoFe layer $12a_4$ having a thickness of 4 nm, and an antiferromagnetic layer 12b of IrMn having a thickness of 10 nm are stacked in this order. As a result, the magnetic layer $12a_4$ on the IrMn layer side has a greater magnetization in the spin injection terminal 12.

The magnetization pinned layer 14a of the ground terminal 14 also has a synthetic structure including a spacer of Ru. Specifically, the ground terminal 14 has a multilayer structure in which a CFGG layer $14a_1$ having a thickness of 5 nm, a CoFe layer $14a_2$ having a thickness of 1 nm, a Ru layer $14a_3$ having a thickness of 1 nm, a CoFe layer $14a_4$ having a thickness of 3 nm, and an antiferromagnetic layer $14b$ of IrMn having a thickness of 10 nm are stacked in this order. As a result, the magnetic layer $14a_1$ on the CFGG layer side has a greater magnetization in the ground terminal 14.

Thus, the thicknesses of the synthetic structures are different from each other. As a result, when the magnetization of the magnetization pinned layers are pinned by magnetic field annealing during which a magnetic field is applied to the spin valve element in the longitudinal direction (the direction in which the nonmagnetic base electrode 10 extends), the magnetization of the magnetic layer $12_4$ on the IrMn layer side, which is greater, in the spin injection terminal 12 is oriented toward the direction of magnetic field, and hence the magnetization of the magnetic layer $12a_2$ on the nonmagnetic base electrode 10 side is oriented to be antiparallel to the magnetic field. In contrast, the magnetization of the magnetic layer $14_2$ on the CFGG layer side, which is greater, in the magnetization ground terminal 14 is oriented toward the magnetic field and hence pinned in the direction parallel to the magnetic field. In this manner, the magnetization directions of the magnetic layers $12a_2$, $14a_2$ of the spin injection terminal 12 and the ground terminal 14 can be pinned to be antiparallel to each other. Both the spin injection terminal 12 and the ground terminal 14 have a width of 12 nm and a length of 10 nm. The spin injection terminal 12 and the ground terminal 14 are covered by an alumina gap film except for through-holes on the top surfaces thereof so as to be insulated from the upper magnetic shield 24. The top surface of the spin injection terminal 12 is connected via the lead terminal $17a$ of Cu to the external lead terminal 18 of Cu that further connects to the current source 30, and the ground terminal 14 is connected via the lead terminal $17b$ of Cu to the upper magnetic shield 24.

In Example 1, the external lead terminal 18 and the upper magnetic shield 24 are connected to the current source 30, and the upper magnetic shield 24 and the lower magnetic shield 22 are connected to the voltmeter 32.

With such a structure, a gap of 15 nm can be obtained between the lower magnetic shield 22 and the upper magnetic shield 24, and a head output of 2 mV can be obtained from a sense current of 50 µA. As a result, a head SN ratio of 25 dB can be obtained by using Example 1 in combination with a magnetic medium of 5 Tbit/in$^2$.

EXAMPLE 2

Figure 19:
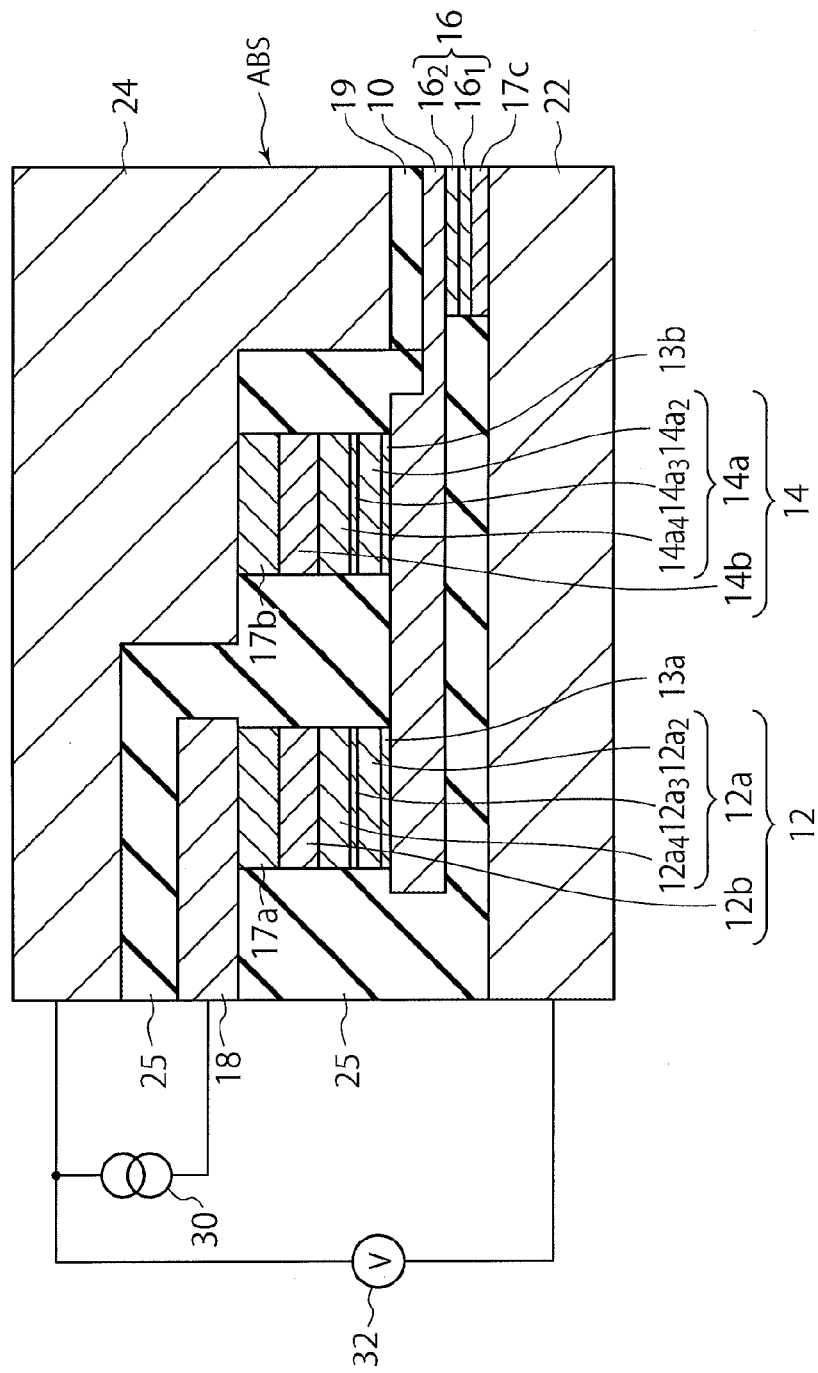
FIG. 19 is a cross-sectional view showing a hard disk head according to Example 2.

FIG. 19 shows a hard disk head according to Example 2. The hard disk head according to Example 2 is the hard disk head according to the second embodiment, and having the same structure as the hard disk head according to Example 1, except that the materials of the spin injection terminal 12, the ground terminal 14, and the spin detection terminal 16 are different. The dimensions of the respective elements are the same as those of Example 1. The spin detection terminal 16 of Example 2 has a multilayer structure including a CoFeB layer $16_1$ having a thickness of 5 nm, and an MgO layer $16_2$ having a thickness of 1 nm formed on the CoFeB layer $16_1$.

The spin injection terminal 12 is formed on a tunnel barrier layer $13a$ of MgO having a thickness of 1 nm, which is disposed on the nonmagnetic base electrode 10, and includes a magnetic layer $12a$ and an antiferromagnetic layer $12b$ of PtMn having a thickness of 10 nm, which is disposed on the magnetic layer $12a$ and pins the magnetization direction of the magnetic layer $12a$. The magnetic layer $12a$ has a synthetic structure including a spacer of Ru. Specifically, the magnetic layer $12a$ has a multilayer structure in which a CoFeB layer $12a_2$ having a thickness of 4 nm, a Ru layer $12a_3$ having a thickness of 1 nm, and a CoFeB layer $12a_4$ having a thickness of 5 nm are stacked in this order.

The ground terminal 14 is formed on a tunnel barrier layer $13b$ of MgO having a thickness of 1 nm disposed on the nonmagnetic base electrode 10, and includes a magnetic layer $14a$ and an antiferromagnetic layer $14b$ of PtMn having a thickness of 10 nm, disposed on the magnetic layer $14a$ to pin the magnetization direction of the magnetic layer $14a$. The magnetic layer $14a$ has a synthetic structure including a spacer of Ru. Specifically, the magnetic layer $14a$ has a multilayer structure in which a CoFeB layer $14a_2$ having a thickness of 5 nm, a Ru layer $14a_3$ having a thickness of 1 nm, and a CoFeB layer $14a_4$ having a thickness of 4 nm are stacked in this order.

In Example 2, the external lead terminal 18 and the upper magnetic shield 24 are connected to the current source 30, and the upper magnetic shield 24 and the lower magnetic shield 22 are connected to the voltmeter 32.

When the spin transfer and the spin detection are performed through a tunnel junction of CoFeB and MgO as in the above structure, the resistance value between terminals on the spin detection side becomes as high as 3 kΩ. However, an output as large as 5 mV can be obtained with a sense current of 30 µA. Therefore, if the hard disk head according to Example 2 is combined with a magnetic recording medium of 5 Tbit/in$^2$, a head output of 25 dB can be obtained.

EXAMPLE 3

Figure 20:
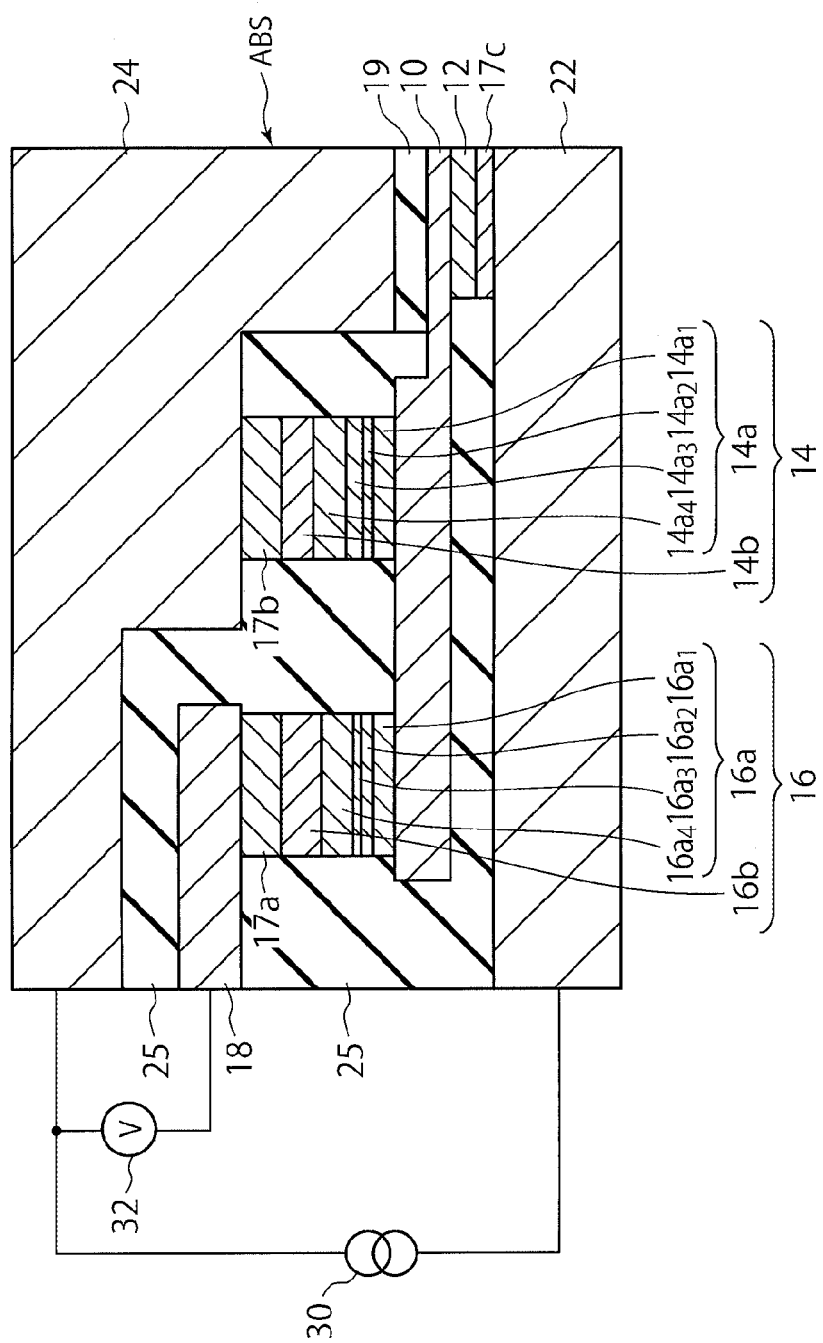
FIG. 20 is a cross-sectional view showing a hard disk head according to Example 3.

FIG. 20 shows a hard disk head according to Example 3. The hard disk head of Example 3 is the hard disk head according to the modification of the second embodiment shown in FIG. 17, and the dimensions of the respective elements are the same as those of Example 1. Thus, the magnetic layers of the ground terminal 14 and the spin detection terminal 16 are magnetization pinned layers.

The ground terminal 14 has a multilayer structure in which a CFGG layer $14a_1$ having a thickness of 5 nm, a CoFeB layer $14a_2$ having a thickness of 1 nm, a Ru layer $14a_3$ having a thickness of 1 nm, a CoFeB layer $14a_4$ having a thickness of 4 nm, and a PtMn layer $14b$ having a thickness of 10 nm are stacked in this order. Thus, the magnetic layer $14a$ has a synthetic structure including the CFGG layer $14a_1$, the CoFeB layer $14a_2$, the Ru layer $14a_3$, and the CoFeB layer $14a_4$.

Similarly, the spin detection terminal 16 has a multilayer structure in which a CFGG layer $16a_1$ having a thickness of 5 nm, a CoFeB layer $16a_2$ having a thickness of 1 nm, a Ru layer $16a_3$ having a thickness of 1 nm, a CoFeB layer $16a_4$ having a thickness of 4 nm, and a PtMn layer $16b$ having a thickness of 10 nm are stacked in this order. Thus, the magnetic layer $16a$ has a synthetic structure including the CFGG layer $16a_1$, the CoFeB layer $16a_2$, the Ru layer $16a_3$, and the CoFeB layer $16a_4$.

The spin injection terminal 12 includes a CFGG layer having a thickness of 5 nm.

In Example 3, the lower magnetic shield 22 and the upper magnetic shield 24 are connected to the current source 30, and the external lead terminal 18 and the upper magnetic shield 24 are connected to the voltmeter 32.

The two terminals, the ground terminal 14 and the spin detection terminal 16, of Example 3 have the same structure. Accordingly, the magnetizations thereof are pinned to the same direction if magnetic field annealing is performed thereon with a magnetic field being applied in the longitudinal direction of the spin valve element. In contrast, a magnetic field bias is applied to the spin injection terminal 12 having a magnetic layer serving as a free layer by means of a hard bias film disposed on the side surface of the spin injection terminal 12. Accordingly, the magnetization thereof is in parallel to the ABS. If a recording magnetic field is applied from a recording medium in this state, the magnetization of the magnetic layer, which is a free layer, of the spin injection terminal 12 is rotated. In accordance with the rotation, the amount of spin accumulation in the nonmagnetic base electrode 10 of Cu varies. Specifically, as the magnetization directions of the magnetic layers in the spin injection terminal 12 and the ground terminal 14 become close to the antiparallel directions, the spin accumulation increases, and as they become close to the parallel directions, the spin accumulation decreases. As a result, the voltage generated at the spin detection terminal 16 including the magnetization pinned layer varies. An output can be obtained by detecting such a voltage. An output of 1.5 mV can be obtained using a sense current of 50 µA.

EXAMPLE 4

Figure 21:
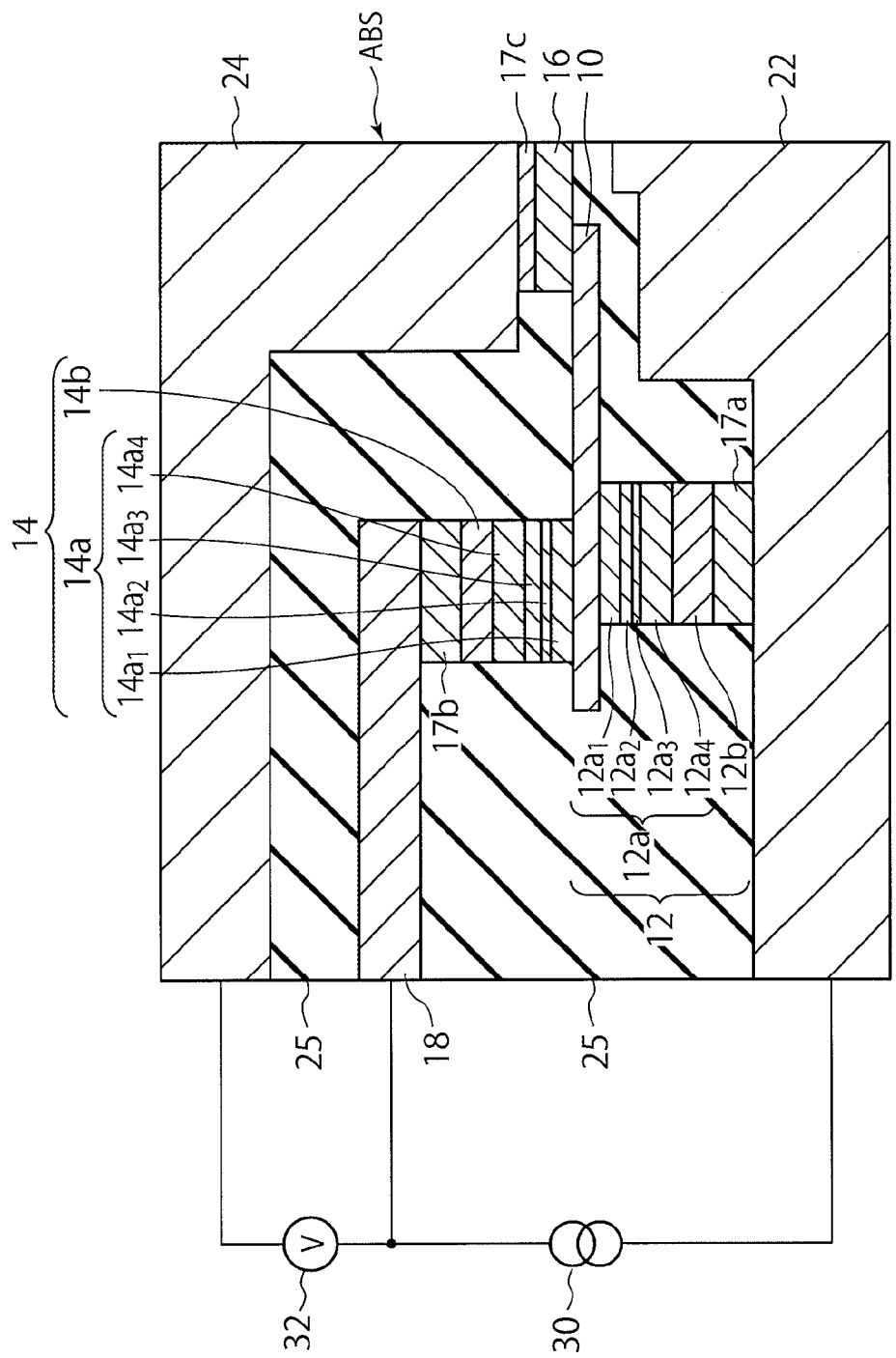
FIG. 21 is a cross-sectional view showing a hard disk head according to Example 4.

FIG. 21 shows a hard disk head according to Example 4. In the hard disk head according to Example 4, the spin injection terminal 12 is disposed between the lower magnetic shield 22 and the nonmagnetic base electrode 10 of Cu, and connected to the lower magnetic shield 22 via the lead terminal 17a of Cu. The spin injection terminal 12 has, on the lead terminal 17a, a multilayer structure in which an antiferromagnetic layer 12b of PtMn having a thickness of 10 nm, a CoFeB layer $12a_4$ having a thickness of 4 nm, a Ru layer $12a_3$ having a thickness of 1 nm, a CoFeB layer $12a_2$ having a thickness of 1 nm, and a CFGG layer $12a_1$ having a thickness of 5 nm are stacked in this order. The CoFeB layer $12a_4$, the Ru layer $12a_3$, the CoFeB layer $12a_2$, and the CFGG layer $12a_1$ form a magnetic layer 12a having a synthetic structure. The CFGG layer $12a_1$ is connected to the lower surface of the nonmagnetic base electrode 10. The spin injection terminal 12 has a width of 12 nm and a length of 10 nm. The nonmagnetic base electrode 10 of Cu has a length of 50 nm, a width of 12 nm, and a thickness of 10 nm. Incidentally, the length means the dimension in the direction along which the nonmagnetic base electrode 10 extends. The thickness means the dimension between the top surface and the bottom surface, and the width means the dimension in the direction perpendicular to the length direction and the thickness direction.

The ground terminal 14 is disposed on a surface of the nonmagnetic base electrode 10 opposite to the spin injection terminal 12, so as to be substantially opposed to the spin injection terminal 12. The ground terminal 14 has a multilayer structure in which a CFGG layer $14a_1$ having a thickness of 3 nm, a CoFeB layer $14a_2$ having a thickness of 1 nm, a Ru layer $14a_3$ having a thickness of 1 nm, a CoFeB layer $14a_4$ having a thickness of 5 nm, and an antiferromagnetic layer 14b of PtMn having a thickness of 10 nm are stacked in this order. The CFGG layer $14a_1$, the CoFeB layer $14a_2$, the Ru layer $14a_3$, and the CoFeB layer $14a_4$ form a magnetic layer 14a having a synthetic structure. The ground terminal 14 is connected to the external lead terminal 18 via a lead terminal 17b on the antiferromagnetic layer 14b.

The spin detection terminal 16 is disposed on the same side as the ground terminal 14 on the nonmagnetic base electrode 10, and includes a CFGG layer having a thickness of 5 nm. A lead terminal 17c of Cu having a thickness of 2 nm is formed on the CFGG layer 16. The spin detection terminal 16 is connected to the upper magnetic shield 24 via the lead terminal 17c. The spin detection terminal 16 and the lead terminal 17c project from an end face of the nonmagnetic base electrode 10 toward the ABS. The spin detection terminal 16 has a width of 12 nm, a length of 10 nm, and a thickness of 5 nm.

An insulating layer 25 is formed between the nonmagnetic base electrode 10 and the lower magnetic shield 22, and between the nonmagnetic base electrode 10 and the upper magnetic shield 24 so that they are not directly in contact with each other. The insulating layer 25 is formed of, for example, alumina.

Hard magnetic films (not shown) are disposed on both sides of the spin detection terminal 16 to apply a hard film bias magnetic field, so that the magnetization of the spin detection terminal 16 is oriented to the direction parallel to the ABS. Magnetic field annealing is performed so that the magnetization directions of the CFGG layers $12a_1$, $14a_1$ of the spin injection terminal 12 and the ground terminal 14 are pinned to be antiparallel to each other.

In Example 4, the lower magnetic shield 22 and the external lead terminal 18 are connected to the current source 30, and the external lead terminal 18 and the upper magnetic shield 24 are connected to a voltmeter 32.

With such a structure, a gap of 15 nm can be obtained between the magnetic shields, and a head output of 2 mV can be obtained from a sense current of 50 µA as in the case of Example 1. As a result, a head SN of 25 dB can be obtained when the magnetic head of Example 4 is used in combination with a magnetic recording medium of 5 Tbit/in$^2$.

EXAMPLE 5

The hard disk head according to Example 1 shown in FIG. 18 is modified so that the spin injection terminal 12 has a simple magnetization pinning structure instead of the synthetic structure. Specifically, the spin injection terminal shown in FIG. 18 is modified to have a multilayer structure in which a CFGG layer having a thickness of 5 nm, a CoFeB layer having a thickness of 1 nm, and an antiferromagnetic layer of IrMn having a thickness of 10 nm are stacked in this order. Except for this, Example 5 has the same structure as Example 1.

In Example 5, the spin injection terminal does not have a synthetic structure, but the ground terminal has a synthetic structure. Accordingly, if magnetization-pinning annealing is performed under a high magnetic field by which the magnetizations of the synthetic structure are oriented to the same direction, the magnetization of the spin injection terminal and the magnetization of the CFGG layer of the ground terminal are pinned to be antiparallel to each other under a low magnetic field.

With such a structure, a gap of 15 nm can be obtained between the lower magnetic shield and the upper magnetic shield, and a head output of 2 mV can be obtained from a sense current of 50 µA. As a result, a head SN of 25 dB can be obtained if the hard disk head of Example 5 is combined with a magnetic recording medium having a 5 Tbit/in$^2$.

COMPARATIVE EXAMPLE 1

Figure 22:
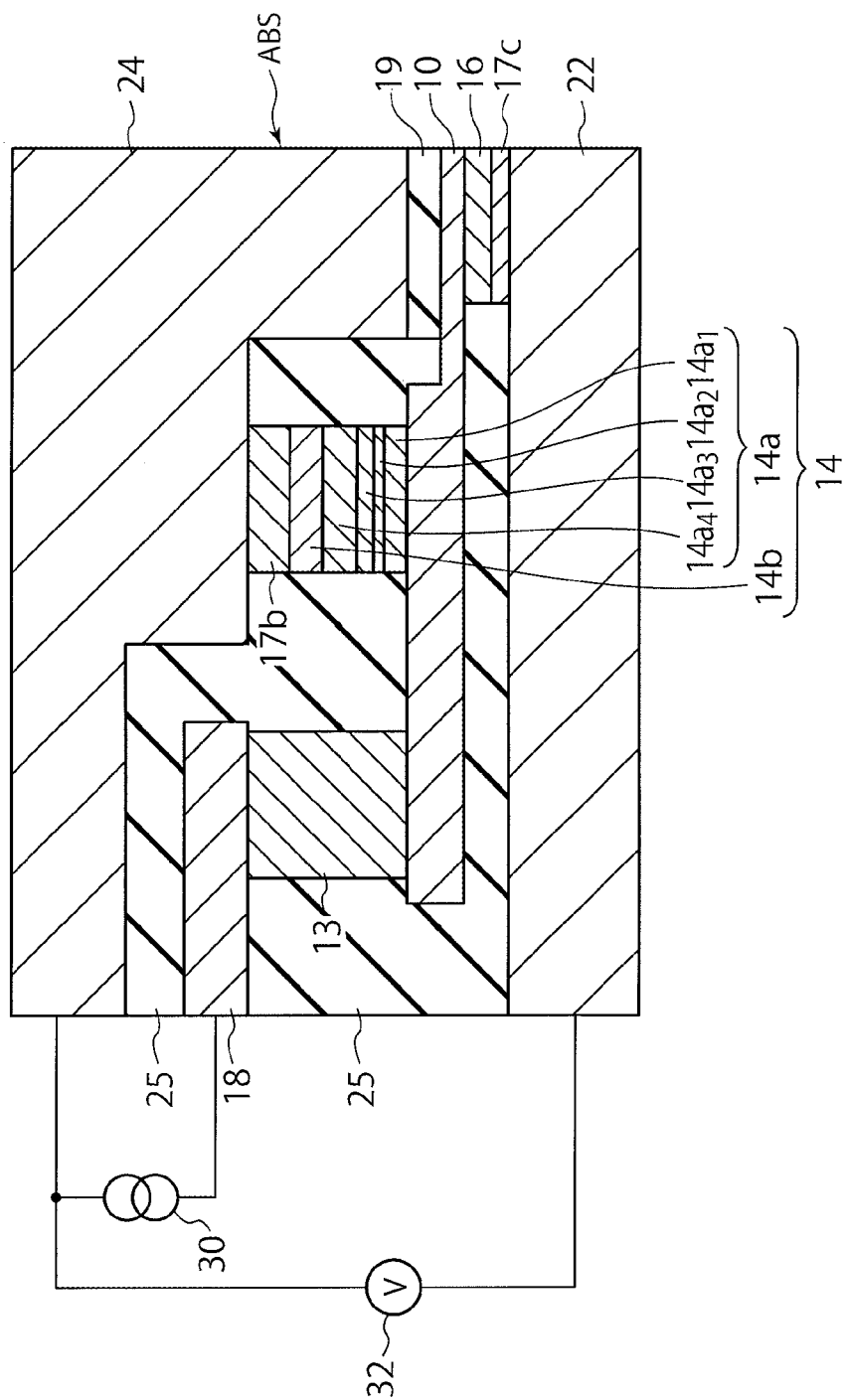
FIG. 22 is a cross-sectional view showing a hard disk head according to Comparative Example 1.

FIG. 22 shows a hard disk head according to Comparative Example 1, which corresponds to Example 1. The hard disk head according to Comparative Example 1 is obtained by replacing the spin injection terminal 12 with a Cu layer 13 in the hard disk head according to Example 1 shown in FIG. 18. Except for the Cu layer 13, Comparative Example 1 has the same structure as Example 1.

In Comparative Example 1, the spin accumulation in the nonmagnetic base electrode 10 is considerably decreased by the external lead terminal 18, and only an output of 0.2 mV can be obtained from a sense current of 50 µA. Therefore, no output can be read if Comparative Example 1 is combined with a magnetic recording medium of 5 Tbit/in$^2$.

COMPARATIVE EXAMPLE 2

Figure 23:
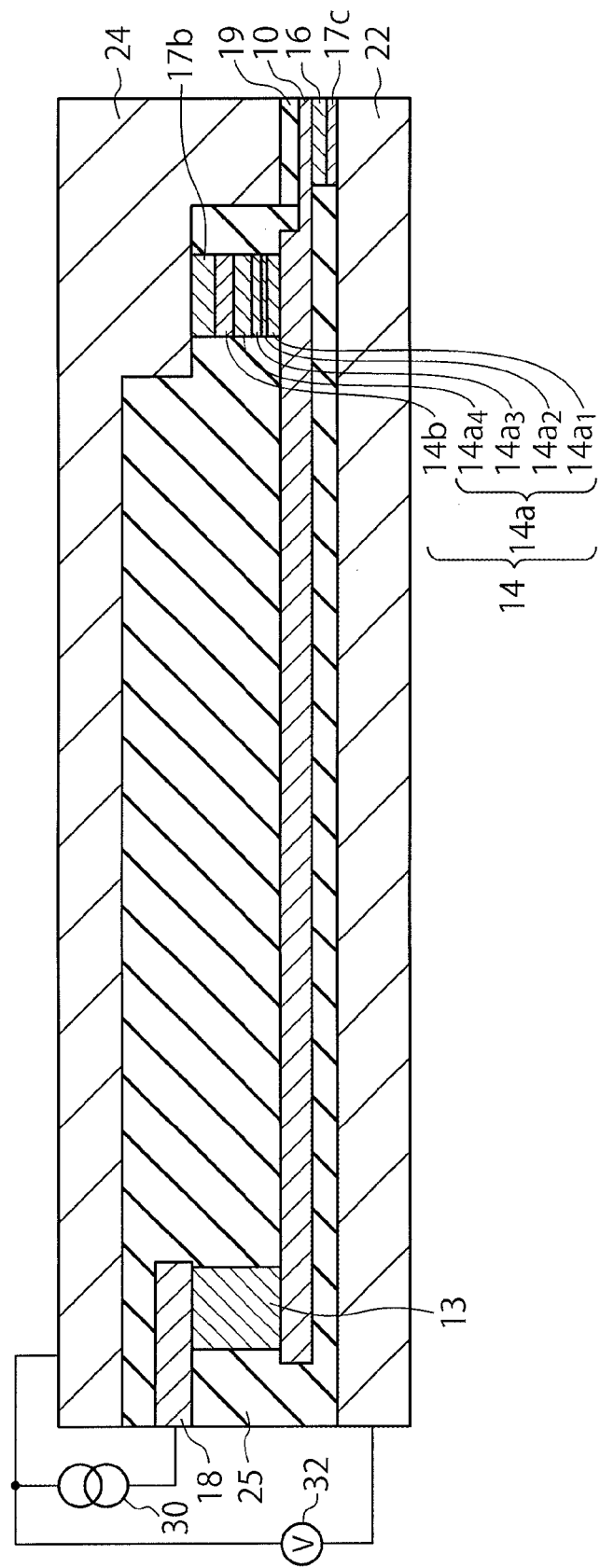
FIG. 23 is a cross-sectional view showing a hard disk head according to Comparative Example 2.

FIG. 23 shows a hard disk head according to Comparative Example 2. The hard disk head according to Comparative Example 2 is obtained by increasing the length of the nonmagnetic base electrode 10 of Cu so that the distance between the Cu layer 13 and the ground terminal 14 reaches 100 nm in the hard disk head of Comparative Example 1.

Since the spin relaxation length in Cu is about 400 nm in Comparative Example 2, the length of the nonmagnetic base electrode 10 is not sufficient to obtain satisfactory spin accumulation. In addition, since the length of the nonmagnetic base electrode 10 is increased, the resistance between the external lead terminal 18 and the spin detection terminal 16 is increased, which increases thermal noise. Furthermore, the heat generated by the sense current increases, and the thermal stability is degraded. Moreover, the probability of generating defects in the process increases, and the yield is reduced. Due to the influence of the foregoing, only an output of 0.5 mV is obtained and only a signal-to-noise ratio of 15 dB is obtained from a sense current of 50 µA. Therefore, even if Comparative example 2 is combined with a magnetic recording medium of 5 Tbit/in$^2$, no output can be read.

COMPARATIVE EXAMPLE 3

Figure 24:
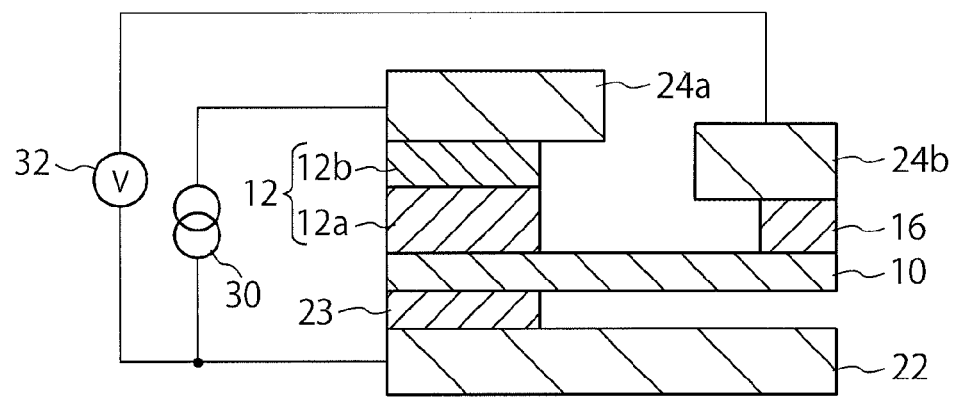
FIG. 24 is a cross-sectional view of a three-terminal, non-local spin valve element according to Comparative Example 3.

FIG. 24 shows a three-terminal, non-local spin valve element according to Comparative Example 3. The three-terminal, non-local spin valve element of Comparative Example 3 is manufactured in the following manner. A Cu layer 23 is formed on a lower magnetic shield 22. The Cu layer 23 is surrounded by an insulating layer of, for example, alumina (not shown). Thereafter, a nonmagnetic base electrode 10 of Cu is formed on the insulating layer by a sputtering method so as to connect to the Cu layer 23. The nonmagnetic base electrode 10 has a thickness of 5 nm, a width of 12 nm, and a length of 100 nm. A spin injection terminal 12 and a spin detection terminal 16 are formed by a sputtering method so as to be in contact with the nonmagnetic base electrode 10. The spin injection terminal 12 includes a magnetic layer 12a having a synthetic structure including a spacer of Ru, and an antiferromagnetic layer 12b formed on the magnetic layer 12a. The magnetic layer 12a has a multilayer structure, in which a CFGG layer having a thickness of 4 nm, a CoFe layer having a thickness of 1 nm, a Ru layer having a thickness of 1 nm, and a CoFe layer having a thickness of 5 nm are stacked in this order. The antiferromagnetic layer 12b is formed of PtMn having a thickness of 10 nm.

The spin detection terminal 16 is formed by depositing a CFGG Heusler alloy, which is a half metal, by a sputtering method. The spin detection terminal 16 has a thickness of 5 nm, a width of 12 nm, and a length of 10 nm.

A Cu layer having a thickness of 2 nm and an alumina gap film surrounding the Cu layer are formed so that the upper portion of the spin injection terminal 12 is connected to an upper magnetic shield 24a via a through-hole filled with Cu (not shown). Furthermore, a Cu layer having a thickness of 2 nm and an alumina gap film surrounding the Cu layer are formed so that the upper portion of the spin detection terminal 16 is connected to an upper magnetic shield 24b via a through-hole filled with Cu (not shown). Thereafter, the upper magnetic shields 24a, 24b are formed.

The magnetization of the magnetic layer in the spin injection terminal 12 is pinned by magnetic field annealing, in which a magnetic field is applied in the longitudinal direction of the spin valve element (the direction in which the nonmagnetic base electrode extends). The spin detection terminal 16 biases the magnetization so as to be parallel to the ABS by means of a hard film formed on the side surface thereof.

With such a structure, the gap between the lower magnetic shield 22 and the upper magnetic shield 24b can be set at 15 nm.

In Comparative Example 3, a current source 30 is connected to the lower magnetic shield 22 and the upper magnetic shield 24a, and a voltmeter 32 is connected to the lower magnetic shield 22 and the upper magnetic shield 24b.

However, since the nonmagnetic base electrode 10 is connected to the lower magnetic shield 22 at a short distance via the through-hole filled with Cu 23 of a nonmagnetic material, the spin accumulation in the nonmagnetic base electrode 10 is short-circuited by the lower magnetic shield 22. As a result, substantially no spin accumulation occurs. Furthermore, the material used to form the magnetic shields does not have satisfactory spin polarization. As a result, unnecessary spin scattering occurs at a connection surface. Moreover, the magnetization of the lower magnetic shield 22 is varied by an external magnetic field, which leads to noises, and hence a good signal-to-noise ratio cannot be obtained. A magnetic shield is designed to function as a magnetic shield, but is not intended to cause a spin valve MR. Accordingly, Comparative Example 3 cannot work as a hard disk head for reproducing signals from a magnetic recording medium.

COMPARATIVE EXAMPLE 4

Figure 25:
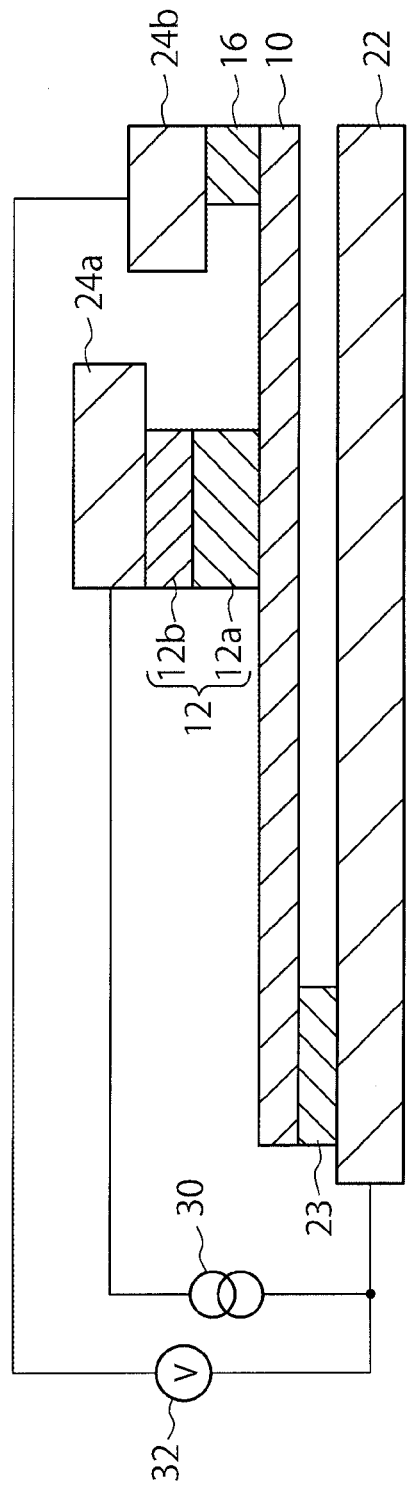
FIG. 25 is a cross-sectional view showing a three-terminal, non-local spin valve element according to Comparative Example 4.

FIG. 25 shows a hard disk head according to Comparative Example 4. The hard disk head according to Comparative Example 4 is obtained by increasing the length of the nonmagnetic base electrode 10 of Cu to be 100 nm in the hard disk head according to Comparative Example 3.

Since the spin relaxation length of Cu is about 400 nm, the length of the nonmagnetic base electrode 10 is not satisfactory in Comparative Example 4. Accordingly the spin accumulation cannot be obtained sufficiently. In addition, since the length of the nonmagnetic base electrode 10 is increased, the resistance between the lower magnetic shield 22 and the spin detection terminal increases to increase the thermal noise. Furthermore, the heat generated by a sense current increases and the thermal stability degrades. Moreover, the probability of generating defects in the process increases, and the yield is reduced. Due to the influences of the foregoing, the hard disk head according to Comparative Example 5 cannot reproduce signals from a magnetic recording medium.
(Third Embodiment)

A magnetic recording and reproducing apparatus according to the third embodiment will be described below.

The hard disk head according to the second embodiment described above is incorporated into, for example, a recording and reproducing type magnetic head assembly, and further incorporated into a magnetic recording and reproducing apparatus (HDD). The magnetic recording and reproducing apparatus according to the third embodiment may have a reproducing function, and may have both a recording function and a reproducing function.

Figure 26:
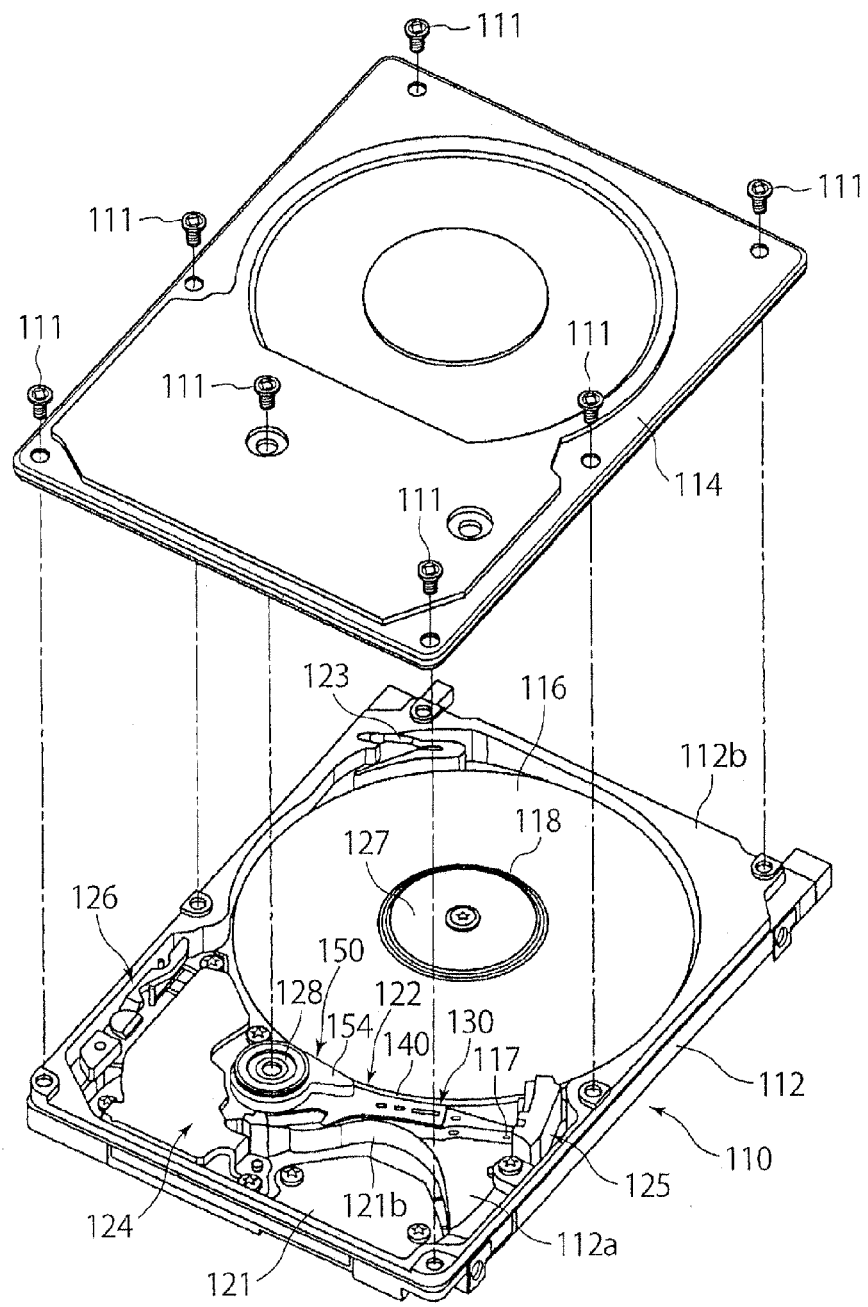
FIG. 26 is a perspective view showing the structure of a magnetic recording and reproducing apparatus according to the third embodiment.

FIG. 26 is a perspective view showing a structure of the magnetic recording and reproducing apparatus according to the third embodiment. As shown in FIG. 26, the magnetic recording and reproducing apparatus includes a housing 110. The housing 110 includes a base 112 in a rectangular box shape, of which the top surface is open, and a top cover 114 to be fastened to the base 112 by a plurality of bolts 111 to close the opening on the top surface of the base 112. The base 112 includes a bottom plate 112a in a rectangular shape, and a sidewall 112b standing along the periphery of the bottom plate 112a.

The housing 110 houses a magnetic disk 116 serving as a recording medium, and a spindle motor 118 serving as a driving unit for supporting and rotating the magnetic disk 116. The spindle motor 118 is disposed on the bottom plate 112a. The housing 110 has a size enabling the housing of plural, for example two, magnetic disks, and the spindle motor 118 is capable of supporting and driving two magnetic disks.

The housing 110 also houses a plurality of hard disk heads 117 for recording information to and reproducing information from the magnetic disk 116, a head stack assembly ("HSA") 122 for supporting the hard disk heads 117 so as to be freely moved relative to the magnetic disk 116, a voice coil motor ("VCM") 124 for pivoting and positioning the HSA 122, a ramp loading mechanism 125 for moving and holding the hard disk head 117 at a retracting position that is at a distance from the magnetic disk 116 when the hard disk head 117 reaches the outermost portion of the magnetic disk 116, a latch mechanism 126 for holding the HSA 122 at the retreating position when an impact is given to the HDD, and a substrate unit 121 including a preamplifier. A printed circuit board that is not shown is fastened by bolts to the outer surface of the bottom plate 112a of the base 112. The printed circuit board controls operations of the spindle motor 118, the VCM 124, and the hard disk heads 117 via the substrate unit 121. A circulation filter 123 for capturing dusts within the housing by driving a movable portion thereof is provided to a sidewall of the base 112 at a position outside the magnetic disk 116.

The magnetic disk 116 has a diameter of, for example, 65 mm (2.5 inches), and includes magnetic recording layers under the top surface and above the bottom surface. The magnetic disk 116 is coaxially engaged with a hub (not shown) of the spindle motor 118, and clamped by a clamp spring 127 to be fixed to the hub. In this manner, the magnetic disk 116 is supported to be in parallel with the bottom plate 112a of the base 112. The magnetic disk 116 is rotated by the spindle motor 118 at a predetermined speed, for example, 5400 rpm or 7200 rpm.

Figure 27:
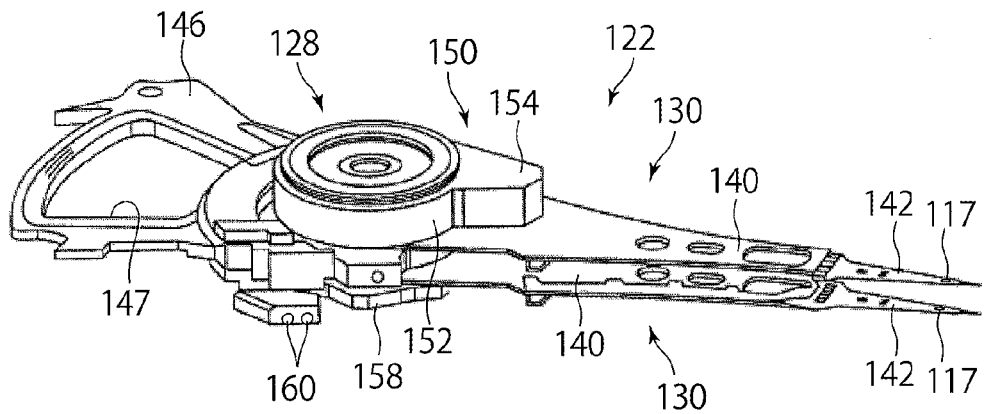
FIG. 27 is a perspective view showing a head stack assembly.
Figure 28:
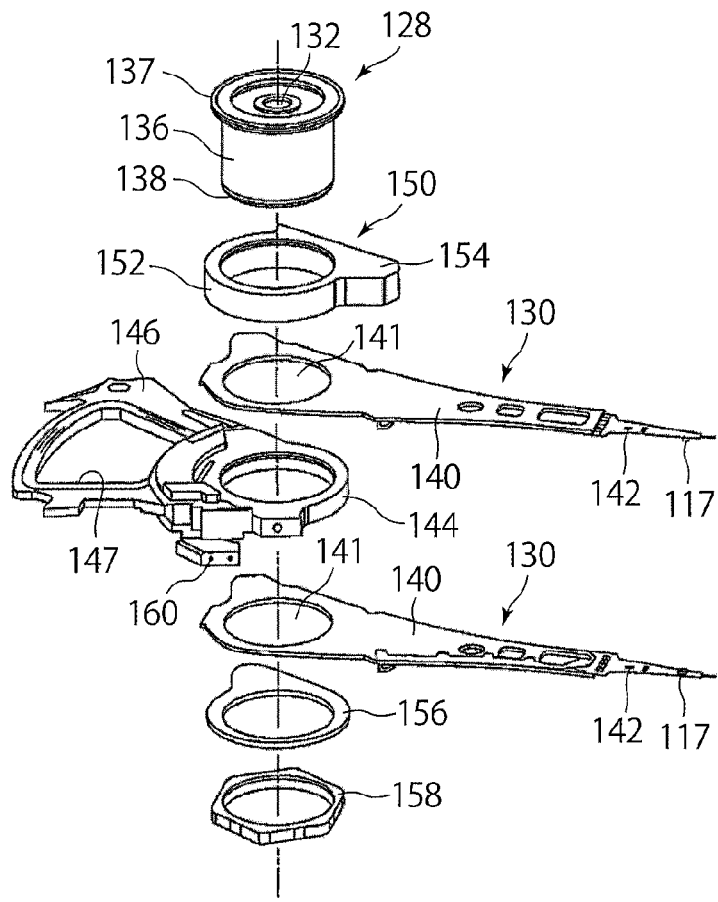
FIG. 28 is an exploded perspective view showing a head stack assembly.

FIG. 27 is a perspective view showing the head stack assembly (HSA) 122 of the magnetic recording and reproducing apparatus according to the third embodiment, and FIG. 28 is an exploded perspective view of the HSA 122. As shown in FIGS. 27 and 28, the HSA 122 includes a bearing unit 128 that can be freely rotated, two head gimbal assemblies ("HGAs") 130 extending from the bearing unit 128, a spacer ring 144 disposed within the HGAs 130, and a dummy spacer 150.

The bearing unit 128 is located along the longitudinal direction of the base 112 at a distance from the rotation center of, and near the outer periphery of the magnetic disk 116. The bearing unit 128 includes a pivot axis 132 standing on the bottom plate 112a of the base 112, and sleeve 136 in a cylindrical shape, which is coaxially supported by the pivot axis 132 so as to be rotated freely around the pivot axis 132 via the bearings 134. A flange 137 in a ring shape is disposed on the upper portion of the sleeve 136, and a screw portion 138 is formed on the outer periphery of the lower portion. The sleeve 136 of the bearing unit 128 has a size, i.e., a length in the axial direction, sufficiently enough to fix, for example, at maximum of four HGAs and spacers between the adjacent HGAs 130.

In the third embodiment, the number of magnetic disk 116 is one. Accordingly, two HGAs 130, which are fewer than the maximum attachable number of four, are fixed to the bearing unit 128. Each HGA 130 includes an arm 140 extending from the bearing unit 128, a suspension 142 extending from the arm, and a hard disk head 117 supported at the extended end of the suspension via a gimbal portion.

The arm 140 has a laminate structure of, for example, stainless steel, aluminum, and stainless steel, and in a thin flat plate shape. A circular through-hole 141 is formed on one end, i.e., the base end thereof. The suspension 142 is formed of a narrow and long leaf spring, the base portion of which is fixed to an end of the arm 140 by spot welding or gluing so that the suspension 142 extends from the arm 140. The suspension 142 and the arm 140 may be integrally formed of the same material.

The hard disk head 117 is one of the magnetic heads according to the second embodiment, and includes a substantially rectangular slider (not shown) and a recording head formed on the slider. The hard disk head 117 is fixed to the gimbal portion formed at a tip portion of the suspension 142. Furthermore, the hard disk head 117 includes four electrodes, which are not shown. A relay flexible printed circuit board ("relay FPC") is disposed on the arm 140 and the suspension 142, and the hard disk head 117 is electrically connected to a main FPC 121b via the relay FPC.

The spacer ring 144 is formed of aluminum or the like to have a predetermined thickness and a predetermined outside diameter. A support frame 146 of a synthetic resin is integrally formed with the spacer ring 144 and extends outwardly from the spacer ring. A voice coil 147 of the VCM 124 is fixed to the support frame 146.

The dummy spacer 150 includes a spacer body 152 in an annular shape, and a balance adjusting portion 154 extending from the spacer body. The dummy spacer 150 is integrally formed of a metal such as stainless steel. The outside diameter of the spacer body 152 is the same as that of the spacer ring 144. Therefore, the outside diameter of a portion of the spacer body 152 contacting the arm is the same as the outside diameter of a portion of the spacer ring 144 contacting the arm. The thickness of the spacer body 152 is the sum of the thicknesses of the arms of the HGAs, the number of which is fewer than the maximum number, two in this case, and the thicknesses of the spacer rings disposed therebetween.

The dummy spacer 150, the two HGAs 130, and the spacer ring 144 are engaged with the outer periphery of the sleeve 136 of the bearing unit 128 with the sleeve 136 being inserted into the inner hole of the spacer body 152, the through-hole 141 of the arm 140, and the inner hole of the spacer ring. Thus the dummy spacer 150, the two HGAs 130, and the spacer ring 144 are stacked on the flange 137 along the axial direction of the sleeve. The spacer body 152 of the dummy spacer 150 is engaged with the outer periphery of the sleeve 136 so as to be disposed between the flange 137 and one of the arms 140, and the spacer ring 144 is engaged with the outer periphery of the sleeve 136 so as to be disposed between the two arms 140. A washer 156 in an annular shape is engaged with the lower periphery of the sleeve 136.

The dummy spacer 150, the two arms 140, the spacer ring 144, and the washer 156 engaged with the outer periphery of the sleeve 136 are sandwiched between a nut 158 engaged with the screw portion 138 of the sleeve 136 and the flange 137 to be fixed to the outer periphery of the sleeve.

The two arms 140 are located at predetermined positions in the circumferential direction of the sleeve 136, and extend in the same direction from the sleeve. As a result, the two HGAs are integrally rotated with the sleeve 136, and face each other with a predetermined distance therebetween in parallel with the surface of the magnetic disk 116. The support frame 146 integrally formed with the spacer ring 144 extends from the bearing unit 128 in the opposite direction to the arms 140. Two terminals 160 in a pin shape project from the support frame 146, and electrically connect to the voice coil 147 via a wiring (not shown) embedded in the support frame 146.

The suspension 142 has lead lines (not shown) for writing and reading signals, which are connected to respective electrodes of the magnetic head incorporated into the slider. Furthermore, an electrode pad (not shown) is provided to the magnetic head assembly 130.

A signal processing unit (not shown) for writing signals to and reading signals from the magnetic recording medium using the magnetic head is provided. The signal processing unit is disposed on the back side of the magnetic recording and reproducing apparatus shown in FIG. 26. The input and output lines of the signal processing unit are connected to the electrode pad and electrically coupled to the magnetic head.

Thus, the magnetic recording and reproducing apparatus according to the third embodiment includes a magnetic recording medium, any of the hard disk heads according to the second embodiment, a movable unit (movement controller) for separating the magnetic recording medium and the hard disk head from each other, or moving the magnetic recording medium and the hard disk head relative to each other under a contact state, a position controller for positioning the hard disk head at a predetermined recording position of the magnetic recording medium, and a signal processing unit for writing signals to and reading signals from the magnetic recording medium using the hard disk head. The recording medium disk 116 can be used as the aforementioned magnetic recording medium. The aforementioned movable unit may include a slider. Furthermore, the aforementioned position controller may include an HSA 122.

When the magnetic disk 116 is rotated, and the actuator arm 140 is caused to pivot by the voice coil motor 124 to load the slider onto the magnetic disk 116, the air bearing surface (ABS) of the slider on which the hard disk head is mounted is held above the surface of the magnetic disk 116 at a predetermined floating distance therefrom. In this manner, the information recorded on the magnetic disk 116 is read based on the aforementioned principle.

The magnetic recording and reproducing apparatus according to the third embodiment, which uses any of the hard disk heads according to the second embodiment, is capable of increasing the output voltage, and decreasing the gap between shields.

A spin valve element according to an embodiment includes: a nonmagnetic base layer; a first terminal including a first magnetic layer, in which a direction of magnetization is switchable, the first terminal connecting to a portion near one of opposing end faces of the nonmagnetic base layer in a direction along which the nonmagnetic base layer extends; a second terminal including a second magnetic layer, in which a direction of magnetization is pinned, the second terminal being disposed and connecting to the nonmagnetic base layer so as to be at a distance from the first terminal along the direction in which the nonmagnetic base layer extends; a third terminal including a third magnetic layer, in which a direction of magnetization is pinned to be parallel to the direction of magnetization of the second magnetic layer, the third terminal being disposed and connecting to the nonmagnetic base layer so as to be at distances from the first terminal and the second terminal along the direction in which the nonmagnetic base layer extends, the first terminal and the second terminal connecting to a current source that passes a sense current, and the third terminal and one of the first terminal and the second terminal connecting to a voltage detection unit that detects a voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A spin valve element comprising:
a nonmagnetic base layer;
a first terminal including a first magnetic layer, in which a direction of magnetization is switchable, the first terminal connecting to a portion near one of opposing end faces of the nonmagnetic base layer in a direction along which the nonmagnetic base layer extends;
a second terminal including a second magnetic layer, in which a direction of magnetization is pinned, the second terminal being disposed and connecting to the nonmagnetic base layer so as to be at a distance from the first terminal along the direction in which the nonmagnetic base layer extends;
a third terminal including a third magnetic layer, in which a direction of magnetization is pinned to be antiparallel to the direction of magnetization of the second magnetic layer, the third terminal being disposed and connecting to the nonmagnetic base layer so as to be at distances from the first terminal and the second terminal along the direction in which the nonmagnetic base layer extends,
the second terminal and the third terminal connecting to a current source that passes a sense current, and
the first terminal and one of the second terminal and the third terminal connecting to a voltage detection unit that detects a voltage.

2. The element according to claim 1, wherein at least one of the first terminal, the second terminal, and the third terminal includes a layer of half metal magnetic material.

3. The element according to claim 1, further comprising a tunnel barrier layer disposed between each of the first terminal, the second terminal, and the third terminal and the nonmagnetic base layer.

4. The element according to claim 1, wherein the first terminal is disposed on a surface of the nonmagnetic base layer, and the second terminal and the third terminal are disposed on an opposite surface of the nonmagnetic base layer to the first terminal.

5. The element according to claim 1, wherein the second terminal is disposed on a surface of the nonmagnetic base layer, the first terminal and the third terminal are disposed on an opposite surface of the nonmagnetic base layer to the second terminal, and the third terminal is disposed at a position substantially facing the second terminal with the nonmagnetic base layer being disposed therebetween.

6. A hard disk head comprising:
a first magnetic shield;
a second magnetic shield; and
the spin valve element according to claim 1 provided between the first magnetic shield and the second magnetic shield.

7. The head according to claim 6, further comprising an external lead terminal connecting to the second terminal of the spin valve element,
wherein the first magnetic shield is connected to the first terminal of the spin valve element, and the second magnetic shield is connected to the third terminal of the spin valve element.

8. The head according to claim 6, further comprising an external lead terminal connecting to the third terminal of the spin valve element,
wherein the first magnetic shield is connected to the first terminal of the spin valve element, and the second magnetic shield is connected to the second terminal of the spin valve element.

9. The head according to claim 6, wherein at least one of the first terminal, the second terminal, and the third terminal includes a layer of half metal magnetic material.

10. The head according to claim 6, further comprising a tunnel barrier layer disposed between each of the first terminal, the second terminal, and the third terminal and the nonmagnetic base layer.

11. The head according to claim 6, wherein the first terminal is disposed on a surface of the nonmagnetic base layer, and the second terminal and the third terminal are disposed on an opposite surface of the nonmagnetic base layer to the first terminal.

12. The head according to claim 6, wherein the second terminal is disposed on a surface of the nonmagnetic base layer, the first terminal and the third terminal are disposed on an opposite surface of the nonmagnetic base layer to the second terminal, and the third terminal is disposed at a position substantially facing the second terminal with the nonmagnetic base layer being disposed therebetween.

13. A magnetic recording and reproducing apparatus comprising:
a magnetic recording medium;
the hard disk head according to claim 6;
a movement controller that controls relative movements of the magnetic recording medium and the hard disk head so that they move relative to each other in a floating or contacting state, facing each other;
a position controller that controls a position of the hard disk head so as to be at a predetermined position of the magnetic recording medium; and
a signal processing unit that processes a write signal to the magnetic recording medium and a read signal from the magnetic recording medium using the hard disk head.

14. The apparatus according to claim 13, wherein the hard disk head further comprises an external lead terminal connecting to the second terminal of the spin valve element, the first magnetic shield is connected to the first terminal of the spin valve element, and the second magnetic shield is connected to the third terminal of the spin valve element.

15. The apparatus according to claim 13, wherein the hard disk head further comprises an external lead terminal connecting to the third terminal of the spin valve element, the first magnetic shield is connected to the first terminal of the spin valve element, and the second magnetic shield is connected to the second terminal of the spin valve element.

* * * * *